United States Patent
Li et al.

(10) Patent No.: US 12,224,298 B2
(45) Date of Patent: Feb. 11, 2025

(54) BOND PAD STRUCTURE WITH HIGH VIA DENSITY

(71) Applicant: Taiwan Semiconductor Manufacturing Co., Ltd., Hsinchu (TW)

(72) Inventors: Yu-Hsien Li, Hsinchu (TW); Yen-Ting Chiang, Tainan (TW); Shyh-Fann Ting, Tainan (TW); Jen-Cheng Liu, Hsin-Chu (TW); Dun-Nian Yaung, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 459 days.

(21) Appl. No.: 17/391,302

(22) Filed: Aug. 2, 2021

(65) Prior Publication Data
US 2022/0367554 A1    Nov. 17, 2022

Related U.S. Application Data

(60) Provisional application No. 63/189,367, filed on May 17, 2021.

(51) Int. Cl.
*H01L 27/146* (2006.01)

(52) U.S. Cl.
CPC .... *H01L 27/14636* (2013.01); *H01L 27/1463* (2013.01); *H01L 27/1464* (2013.01); *H01L 27/14645* (2013.01); *H01L 27/14689* (2013.01)

(58) Field of Classification Search
CPC ............... H01L 27/14636; H01L 27/1464
See application file for complete search history.

(56) References Cited

U.S. PATENT DOCUMENTS

| | | | | |
|---|---|---|---|---|
| 10,038,025 B2 * | 7/2018 | Huang | .............. | H01L 27/14689 |
| 10,283,549 B2 * | 5/2019 | Huang | .............. | H01L 27/14636 |
| 10,566,374 B2 * | 2/2020 | Huang | .............. | H01L 27/14689 |
| 11,069,736 B2 * | 7/2021 | Huang | .............. | H01L 27/14689 |
| 2006/0006074 A1 | 1/2006 | Liu et al. | | |

(Continued)

FOREIGN PATENT DOCUMENTS

| | | |
|---|---|---|
| JP | 2005123587 A | 5/2005 |
| JP | 2008147352 A | 6/2008 |

(Continued)

*Primary Examiner* — Mounir S Amer
*Assistant Examiner* — Alexander Belousov
(74) *Attorney, Agent, or Firm* — Eschweiler & Potashnik, LLC

(57) ABSTRACT

Various embodiments of the present disclosure are directed towards an integrated circuit (IC) chip in which a bond pad structure extends to a columnar structure with a high via density. For example, an interconnect structure is on a frontside of a substrate and comprises a first bond wire, a second bond wire, and bond vias forming the columnar structure. The bond vias extend from the first bond wire to the second bond wire. The bond pad structure is inset into a backside of the substrate, opposite the frontside, and extends to the first bond wire. A projection of the first or second bond wire onto a plane parallel to a top surface of the substrate has a first area, and a projection of the bond vias onto the plane has a second area that is 10% or more of the first area, such that via density is high.

20 Claims, 27 Drawing Sheets

(56) References Cited

U.S. PATENT DOCUMENTS

| | | | |
|---|---|---|---|
| 2011/0024849 A1 | 2/2011 | Akiyama | |
| 2011/0241217 A1 | 10/2011 | Chang et al. | |
| 2016/0379960 A1* | 12/2016 | Huang | H01L 24/00 |
| 2017/0186802 A1* | 6/2017 | Huang | H01L 27/14689 |
| 2017/0250215 A1* | 8/2017 | Lin | H01L 27/14685 |
| 2018/0342551 A1* | 11/2018 | Cheng | H01L 27/14632 |
| 2018/0350865 A1* | 12/2018 | Huang | H01L 27/14689 |
| 2019/0057998 A1* | 2/2019 | Huang | H01L 27/14634 |
| 2019/0393153 A1 | 12/2019 | Wang et al. | |
| 2020/0075709 A1* | 3/2020 | Wu | H01L 21/76832 |
| 2020/0135794 A1* | 4/2020 | Huang | H01L 27/14689 |

FOREIGN PATENT DOCUMENTS

| | | |
|---|---|---|
| JP | 2011029491 A | 2/2011 |
| JP | 2013038391 A | 2/2013 |
| JP | 2017120912 A | 7/2017 |
| TW | 202114086 A | 4/2021 |

\* cited by examiner

BOND PAD STRUCTURE WITH HIGH VIA DENSITY

REFERENCE TO RELATED APPLICATION

This application claims the benefit of U.S. Provisional Application No. 63/189,367, filed on May 17, 2021, the contents of which are incorporated by reference in their entirety.

BACKGROUND

Many modern-day electronic devices include complementary metal-oxide-semiconductor (CMOS) image sensors that convert optical images to digital data representing the optical images. One type of CMOS image sensor commonly used in electronic devices is a backside illuminated (BSI) image sensor. A BSI image sensor comprises an interconnect structure on a frontside of a semiconductor substrate and is configured to receive radiation from a backside of the semiconductor substrate, opposite the frontside. This arrangement allows the radiation to impinge on photodetectors in the semiconductor substrate without being obstructed by conductive features in the interconnect structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
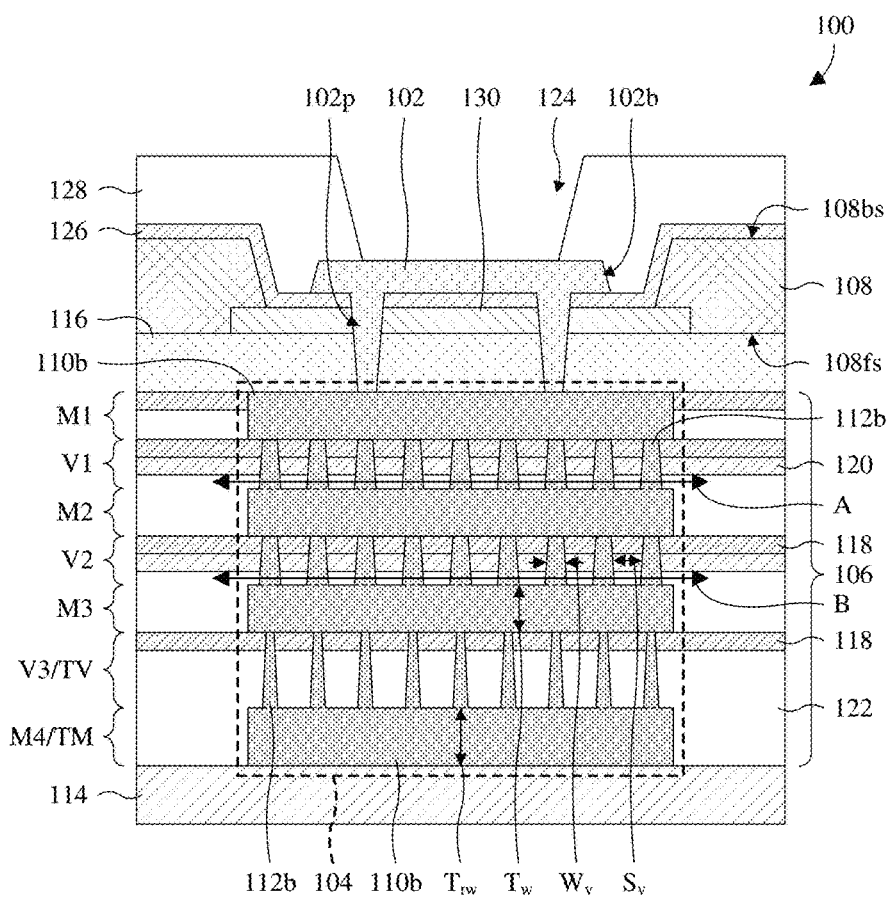
FIG. 1 illustrates a cross-sectional view of some embodiments of an integrated circuit (IC) chip in which a bond pad structure extends to a columnar structure with a high via density.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) chip may comprise an interconnect structure on a frontside of a semiconductor substrate and a bond pad structure on a backside of the semiconductor substrate, opposite the frontside. Such an IC chip may, for example, correspond to a backside illuminated (BSI) image sensor. The interconnect structure comprises a plurality wires and a plurality of inter-wire vias respectively grouped into a plurality of wire levels and a plurality of via levels. The wire levels are alternatingly stacked with the via levels and form a columnar structure. The bond pad structure extends through the semiconductor substrate to the columnar structure and electrically couples to a semiconductor device on the front side of the semiconductor substrate through the columnar structure.

A challenge with the IC chip is that inter-wire vias of the columnar structure may have a low density between a top via level and the semiconductor substrate. For example, the inter-wire vias may have a density less than about 1 percent or some other suitable value. Via density is determined per via level and corresponds to a ratio of via area to wire area respectively for the inter-wire vias at a given via level and an adjoining wire. The via area may, for example, correspond to a top layout area of the inter-wire vias, and the wire area may, for example, correspond to a top layout area of the adjoining wire. Additionally, the wire levels between the top via level and the semiconductor substrate may have small thicknesses, which are only expected to become smaller as IC chips continue to scale down. For example, the wire levels may have thicknesses less than about 1000 angstroms or some other suitable value. The combination of small wire thickness and low via density results in the columnar structure being weak proximate the bond pad structure, whereby the columnar structure has a high likelihood of peeling and hence failure in response to shear force on the bond pad structure.

Various embodiments of the present disclosure are directed towards an IC chip in which a bond pad structure extends to a columnar structure with a high via density at via levels between a top via level and a semiconductor substrate. Such a high via density may, for example, correspond to a via density of more than about 10% or some other suitable value. Because of the high via density, the columnar structure is strong even with wire levels having small thicknesses. Because the columnar structure is strong, shear force on the bond pad structure has a low likelihood of causing peeling and hence failure at the columnar structure. This may, in turn, increase yields when wire bonding or otherwise bonding to the bond pad structure. Further, because of the low likelihood, the IC chip may be scaled down more than would otherwise be possible.

With reference to FIG. 1, a cross-sectional view 100 of some embodiments of an IC chip is provided in which a bond pad structure 102 extends to a columnar structure 104 with a high via density. The columnar structure 104 is formed by an interconnect structure 106, which is on a frontside 108fs of a semiconductor substrate 108.

The interconnect structure 106 comprises a plurality of bond wires 110b and a plurality of inter-wire bond vias 112b forming the columnar structure 104. The bond wires 110b and the inter-wire bond vias 112b are conductive and may, for example, be or comprise copper, aluminum, aluminum copper, some other suitable metal(s), or any combination of the foregoing. The bond wires 110b and the inter-wire bond vias 112b are respectively distributed amongst a plurality of wire levels M1-M4 and a plurality of via levels V1-V3 that are alternatingly stacked.

The wire level closest to the semiconductor substrate 108 corresponds to a first wire level M1, whereas the wire level farthest from the semiconductor substrate 108 corresponds to a fourth wire level M4. Further, the wire level farthest from the semiconductor substrate 108 may also be known as a top wire level TM. The via level closest to the semiconductor substrate 108 corresponds to a first via level V1, whereas the via level farthest from the semiconductor substrate 108 corresponds to a third via level V3. Further, the via level farthest from the semiconductor substrate 108 may also be known as a top via level TV.

The inter-wire bond vias 112b have a high density at the via levels V1, V2 between the semiconductor substrate 108 and the top via level TV. Via density is determined per via level and corresponds to a ratio of via area to wire area respectively for the inter-wire bond vias 112b at a given via level and an adjoining bond wire 110b. The via area may, for example, correspond to a top layout area of the inter-wire bond vias 112b at the given via level, and the wire area may, for example, correspond to a top layout area of the adjoining bond wire 110b. A high density at a given via level may, for example, be a density that is greater than about 10%, about 20%, about 40%, or about 80% and/or a density that is about 10%-30%, about 30%-50%, about 50%-80%, or about 80-99%. Other suitable values are, however, amenable.

Because of the high density at the via levels V1, V2 between the semiconductor substrate 108 and the top via level TV, the columnar structure 104 is strong even when the wire levels M1-M3 between the top via level TV and the semiconductor substrate 108 have a thickness $T_w$ that is small. A small thickness may, for example, be a thickness less than about 1000 angstroms, about 800 angstroms, or some other suitable value. Because the columnar structure 104 is strong, shear force on the bond pad structure 102 has a low likelihood of causing peeling and hence failure at the via levels V1, V2 between the top via level TV and the semiconductor substrate 108. This may, in turn, increase yields when wire bonding or otherwise bonding to the bond pad structure 102. Further, because of the low likelihood of peeling and hence failure, the IC chip may be scaled down more than would otherwise be possible.

The high density may, for example, be achieved by spacing $S_v$ between the inter-wire bond vias 112b, shapes of the inter-wire bond vias 112b, sizes of the inter-wire bond vias 112b, or any combination of the foregoing. In some embodiments, a width $W_v$ of the inter-wire vias is about 0.4-3 micrometers, about 0.4-1 micrometers, about 1-2 micrometers, about 2-3 micrometers, or some other suitable value. In some embodiments, the spacing $S_v$ is about 1-3 micrometers, about 1-2 micrometers, about 2-3 micrometers, or some other suitable value. If the width $W_v$ is too small and/or the spacing $S_v$ is too high, density may be low.

The top wire level TM has a thickness $T_{tw}$ larger than the thickness $T_w$ of the remaining wire levels M1-M3 and is farther from the bond pad structure 102 than the remaining wire levels M1-M3. Therefore, peeling and failure of the columnar structure 104 may be less of a concern at the top wire level TM than at the remaining wire levels M1-M3.

In some embodiments, the inter-wire bond vias 112b at the top via level TV also have the high density. Such embodiments may, for example, arise when the thickness $T_{tw}$ of the top wire level TM is small. As above, a small thickness may, for example, be a thickness less than about 1000 angstroms, about 800 angstroms, or some other suitable value. In other embodiments, the inter-wire bond vias 112b at the top via level TV have a low density. A low density may, for example, be a density less than the high density and/or less than about 1% or some other suitable value. Such other embodiments may, for example, arise when the thickness $T_{tw}$ of the top wire level TM is large. A large thickness may, for example, be a thickness greater than the small thickness and/or greater than about 1200 angstroms or some other suitable value.

In some embodiments, the inter-wire bond vias 112b at the via levels V1, V2 between the semiconductor substrate 108 and the top via level TV have individual via densities that are different. For example, the inter-wire bond vias 112b at the first via level V1 may have a first via density that is high, and the inter-wire bond vias 112b at a second via level V2 may have a second via density that is high but less than or greater than the first via density. In other embodiments, the inter-wire bond vias 112b at the via levels V1, V2 between the semiconductor substrate 108 and the top via level TV share a common via density.

In alternative embodiments, the inter-wire bond vias 112b at the first via level V1 have the high density, but the inter-wire bond vias 112b at the remaining via levels V2, V3 have the low density. More generally, in alternative embodiments, the inter-wire bond vias 112b directly contacting the same bond wire 110b as the bond pad structure 102 have the high density, but the remaining inter-wire bond vias 112b have the low density.

The inter-wire bond vias 112b at each via level adjoin and extend between a lower bond wire and an upper bond wire. For example, the bond wire 110b at the first wire level M1 corresponds to the upper bond wire for the inter-wire bond vias 112b at the first via level V1, and the bond wire 110b at a second wire level M2 corresponds to the lower bond wire for the inter-wire bond vias 112b. In some embodiments, the inter-wire bond vias 112b at any one or each via level V1-V3 completely underlie the adjoining upper bond wire and/or completely overlie the adjoining lower wire. Further, in some embodiments, the inter-wire bond vias 112b at any one or each via level V1-V3 completely overlie any bond wires under the inter-wire bond vias 112b.

The inter-wire bond vias 112b at a given via level (e.g., the first via level V1 or any other via level V2, V3) have a via projection when projected on to a plane extending parallel to a top or bottom surface of the semiconductor substrate 108. Further, the lower bond wire and the upper bond wire adjoining the inter-wire bond vias 112b at the given via level respectively have a lower-wire projection and an upper-wire projection when projected on to the plane. The via projection, the lower-wire projection, and the upper-wire projection are two-dimensional (2D) projections and respectively have a via area, a lower-wire area, and an upper-wire area.

In some embodiments, the plane extends along and/or is at a top or bottom surface of the semiconductor substrate 108, a top or bottom surface of any of the bond wires 110b, or some other suitable surface. Therefore, in some embodiments, the via, lower-wire, and upper-wire projections may be projections onto a top or bottom surface of the semiconductor substrate 108, a top or bottom surface of any of the bond wires 110b, or some other suitable surface.

In some embodiments, a first ratio of the via area to the lower-wire area is high and/or a second ratio of the via area to the upper-wire area is high, such that via density at the given via level is high. Put another way, in some embodiments, the via area is a high percentage of the lower-wire area and/or the upper-wire area, such that via density at the given via level is high. A ratio or percentage may, for example, be high when greater than about 10%, about 20%, about 40%, or about 80% and/or when about 10%-30%, about 30%-50%, about 50%-80%, or about 80%-99%. Other suitable values are, however, amenable. In some embodiments, the via projection completely overlaps with the lower-wire projection and/or the upper-wire projection. In some embodiments, the lower-wire and upper-wire projections are the same. In other embodiments, the lower-wire projection and the upper-wire projection are different.

The columnar structure 104 has a columnar-structure projection when projected on to the plane, and the columnar-structure projection is a 2D projection with a columnar-structure area. In some embodiments, a ratio of the via area to the columnar-structure area is high, such that via density at the given via level is high. Put another way, in some embodiments, the via area is a high percentage of the columnar-structure area, such that via density at the given via level is high. A ratio or percentage may, for example, be high when as above.

The inter-wire bond vias 112b at a given via level (e.g., the first via level V1 or any other via level V2, V3) extend from the adjoining lower bond wire to direct contact with a bottom surface of the adjoining upper bond wire at an interface. The interface has an interface area, and the bottom surface has a surface area. In some embodiments, a ratio of the interface area to the surface area is high, such that via density at the given via level is high. Put another way, in some embodiments, the interface area is a high percentage of the surface area, such that via density at the given via level is high. A ratio or percentage may, for example, be high when as above.

The inter-wire bond vias 112b at a given via level (e.g., the first via level V1 or any other via level V2, V3) have a top layout with a via area. Further, the lower and upper bond wires adjoining the inter-wire bond vias 112b have individual top layouts respectively with a lower-wire area and an upper-wire area. In some embodiments, a first ratio of the via area to the lower-wire area is high and/or a second ratio of the via area to the upper-wire area is high, such that via density at the given via level is high. Put another way, in some embodiments, the via area is a high percentage of the lower-wire area and/or the upper-wire area, such that via density at the given via level is high. A ratio or percentage may, for example, be high when as above.

In some embodiments, the bond wires 110b share a common top layout. In other embodiments, some or all of the bond wires 110b have individual top layouts that are different. In some embodiments, the inter-wire bond vias 112b at a given via level between the semiconductor substrate 108 and the top via level TV have a same top layout as the inter-wire bond vias 112b at each other via level between the semiconductor substrate 108 and the top via level TV. In other embodiments, the inter-wire bond vias 112b at a given via level between the semiconductor substrate 108 and the top via level TV have a different top layout as the inter-wire bond vias 112b at another via level between the semiconductor substrate 108 and the top via level TV.

With continued reference to FIG. 1, a passivation layer 114 underlies the top wire level TM on the frontside 108fs of the semiconductor substrate 108. Further, an interlayer dielectric (ILD) layer 116, a plurality of etch stop layers (ESLs) 118, a plurality of buffer layers 120, and a plurality of intermetal dielectric (IMD) layers 122 are stacked between the semiconductor substrate 108 and the passivation layer 114. The ILD layer 116 is between the first wire level M1 and the semiconductor substrate 108, and the IMD layers 122, the ESLs 118, and the buffer layers 120 are between the ILD layer 116 and the passivation layer 114. The IMD layers 122, the ESLs 118, and the buffer layers 120 surround the interconnect structure 106, and the IMD layers 122 are separated from each other by the ESLs 118 and the buffer layers 120.

The bond pad structure 102 is inset into a backside 108bs of the semiconductor substrate 108, opposite the frontside 108fs, and comprises a pad body 102b and a pair of pad protrusions 102p. The pad body 102b is exposed from the backside 108bs of the semiconductor substrate 108 through a pad opening 124. Further, the pad body 102b is surrounded by and separated from the semiconductor substrate 108 by a backside dielectric liner 126 and a backside dielectric layer 128, the latter of which forms the pad opening 124.

The pad protrusions 102p are respectively on opposite sides of the pad body 102b. Further, the pad protrusions 102p extend from the bottom of the pad body 102b, through a trench isolation structure 130, to the bond wire 110b in the first wire level M1, thereby electrically coupling the bond pad structure 102 to the columnar structure 104. The trench isolation structure 130 extends into the frontside 108fs of the semiconductor substrate 108, between the interconnect structure 106 and the semiconductor substrate 108.

In some embodiments, the semiconductor substrate 108 is a bulk substrate of monocrystalline silicon, a silicon-on-insulator (SOI) substrate, some other suitable type of semiconductor substrate, or any combination of the foregoing. In some embodiments, the semiconductor substrate 108 is or comprises silicon, germanium, some other suitable semiconductor material(s), or any combination of the foregoing.

In some embodiments, the passivation layer 114 is or comprises silicon nitride, silicon oxide, some other suitable dielectric(s), or any combination of the foregoing. In some embodiments, the ILD layer 116 and/or the IMD layers 122 is/are or comprise(s) undoped silicon glass (USG), phosphosilicate glass (PSG), oxide, some other suitable dielectric(s), or any combination of the foregoing. In some embodiments, the ESLs 118 are or comprise silicon nitride, silicon carbide, some other suitable dielectric(s), or any combination of the foregoing. In some embodiments, the buffer layers 120 are or comprise oxide and/or some other suitable dielectric(s).

In some embodiments, the bond pad structure 102 is or comprises copper, aluminum, aluminum copper, some other suitable metal(s), or any combination of the foregoing. In some embodiments, the backside dielectric liner 126 is or comprises an oxide and/or some other suitable dielectric(s). Similarly, in some embodiments, the backside dielectric layer 128 is or comprises oxide and/or some other suitable dielectric(s).

In some embodiments, the trench isolation structure 130 is a shallow trench isolation (STI) structure or some other suitable trench isolation structure. In some embodiments, the trench isolation structure 130 is or comprises oxide and/or some other suitable dielectric(s).

While FIG. 1 illustrates the interconnect structure 106 with four wire levels M1-M4 and three via levels V1-V3, more or less wire levels and more or less via levels are amenable. Further, for different numbers of wire and via levels, the wire and via levels remain alternatingly stacked as in FIG. 1 and the number of via levels remains at one less than the number of wire levels.

Figure 2:
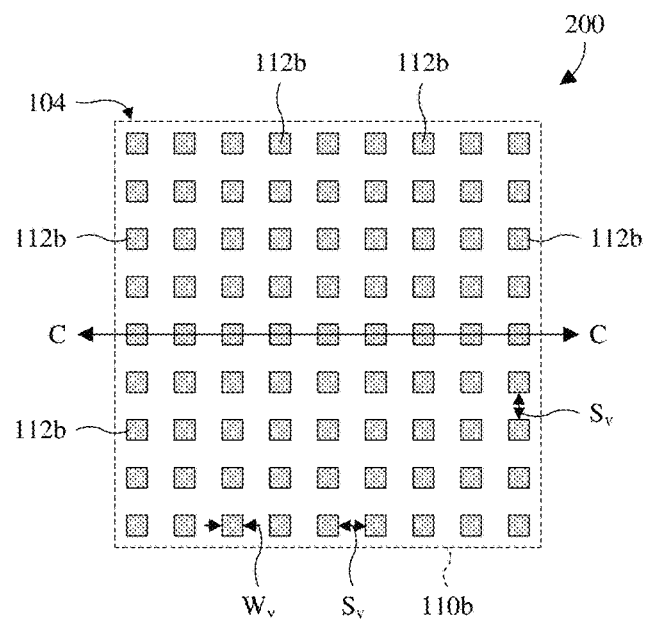
FIG. 2 illustrates a top layout view of some embodiments of a level of inter-wire bond vias forming the columnar structure of FIG. 1.

With reference to FIG. 2, a top layout view 200 of some embodiments of a level of inter-wire bond vias 112b forming the columnar structure 104 of FIG. 1 is provided. The top layout view 200 may, for example, be taken along line A and/or line B in FIG. 1, and/or the cross-sectional view 100 of FIG. 1 may, for example, be taken along line C in FIG. 2.

The inter-wire bond vias 112b are in a plurality of rows and a plurality of columns. Rows extend left to right in the top layout view 200, whereas columns extend top to bottom in the top layout view 200. Further, while seven columns and seven rows are illustrated, more or less rows and/or more or less columns are amenable in alternative embodiments. The inter-wire bond vias 112b overlap a bond wire 110b (shown in phantom) that adjoins the inter-wire bond vias 112b outside the top layout view 200. The bond wire 110b may, for example, be representative of a lower bond wire adjoining the inter-wire bond vias 112b in the cross-sectional view 100 of FIG. 1 and/or may, for example, be representative of an upper bond wire adjoining the inter-wire bond vias 112b in the cross-sectional view 100 of FIG. 1. In some embodiments, the bond wire 110b is representative of each bond wire 110b forming the columnar structure 104 in FIG. 1.

At least when the inter-wire bond vias 112b correspond to a via level V1, V2 between the semiconductor substrate 108 and the top via level TV in FIG. 1, an area occupied by the inter-wire bond vias 112b in FIG. 2 is a high percentage of the area occupied by the bond wire 110b in FIG. 2, such that density of the inter-wire bond vias 112b is high. As above, a percentage and/or a density may be high when greater than about 10% or some other suitable value. Because of the high density, peeling and failure of the columnar structure 104 may be reduced.

In some embodiments, the layout of the inter-wire bond vias 112b in FIG. 2 is the same as or substantially the same as a projection of the inter-wire bond vias 112b onto a plane extending parallel to a top or bottom surface of the semiconductor substrate 108 in FIG. 1. Further, in some embodiments, the layout of the bond wire 110b in FIG. 2 is the same as or substantially the same as a projection of the bond wire 110b onto the plane in FIG. 1.

In some embodiments, the width $W_v$ of the inter-wire bond vias 112b is about 0.4 micrometers, and/or the high percentage and the high density are about 38%. In other embodiments, the width $W_v$ is about 0.5 micrometers, and/or the high percentage and the high density are about 45%. In other embodiments, the width $W_v$ is about 0.6 micrometers, and/or the high percentage and the high density are about 50%. In other embodiments, the width $W_v$, the high percentage, the high density, or any combination of the foregoing has/have other values.

Figure 3:
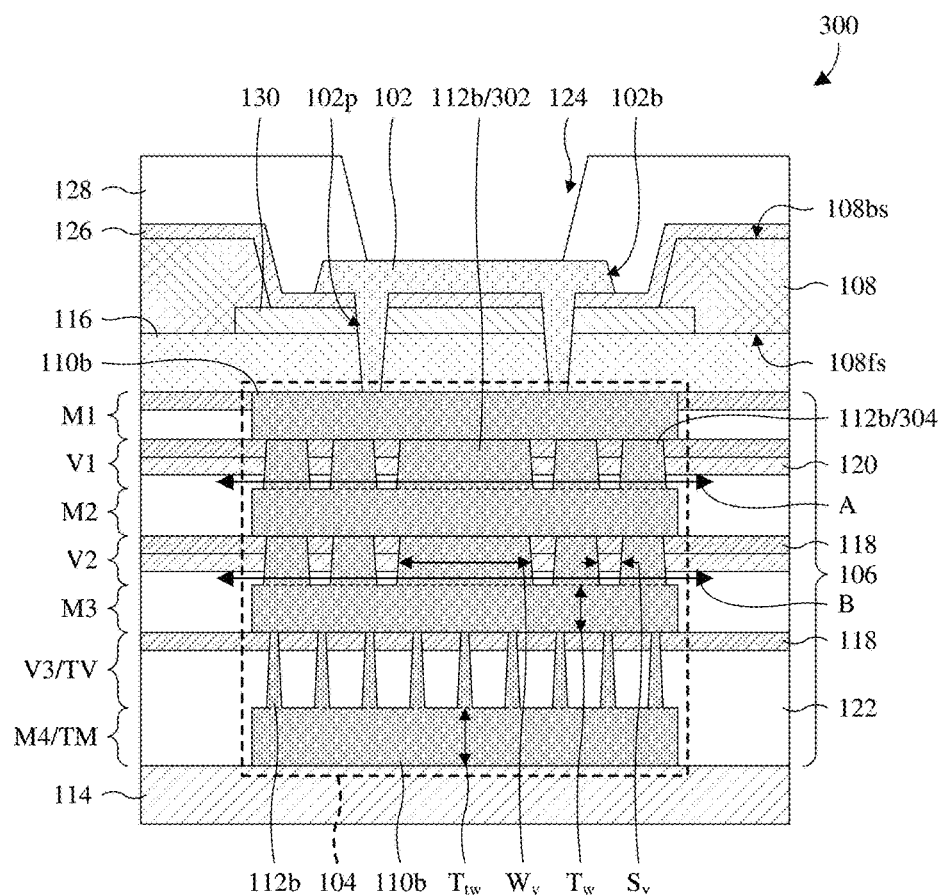
FIG. 3 illustrates a cross-sectional view of some alternative embodiments of the IC chip of FIG. 1 in which a layout of the columnar structure is varied.

With reference to FIG. 3, a cross-sectional view 300 of some alternative embodiments of the IC chip of FIG. 1 is provided in which a layout of the columnar structure 104 is varied. Each via level V1, V2 between the semiconductor substrate 108 and the top via level TV has a central inter-wire bond via 302 laterally between peripheral inter-wire bond vias 304. The central inter-wire bond via 302 is at a width-wise center of the columnar structure 104, and the width $W_v$ of the central inter-wire bond via 302 is larger than that of the peripheral inter-wire bond vias 304. The peripheral inter-wire bond vias 304 are on opposite sides of the central inter-wire bond via 302 and surround the central inter-wire bond via 302.

Figure 4:
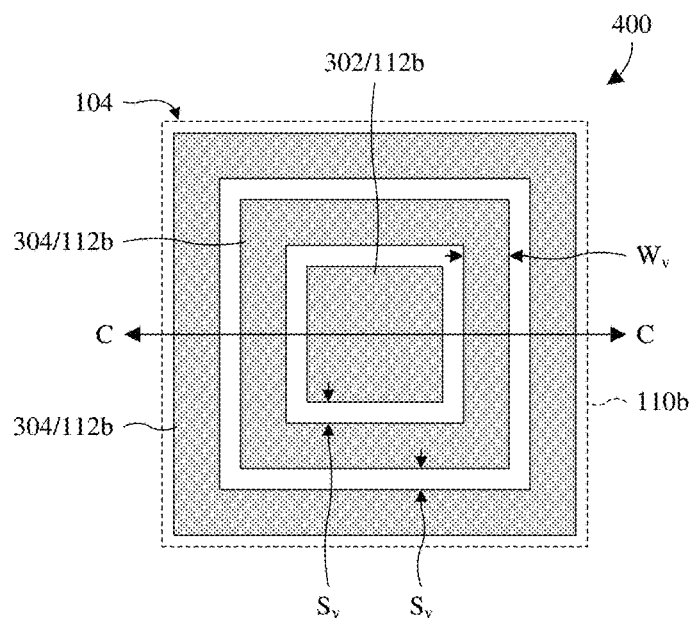
FIG. 4 illustrates a top layout view of some embodiments of a level of inter-wire bond vias forming the columnar structure of FIG. 3.

With reference to FIG. 4, a top layout view 400 of some embodiments of a level of inter-wire bond vias 112b forming the columnar structure 104 of FIG. 3 is provided. The top layout view 400 may, for example, be taken along line A and/or line B in FIG. 3, and/or the cross-sectional view 100 of FIG. 3 may, for example, be taken along line C in FIG. 4.

The peripheral inter-wire bond vias 304 are ring-shaped and surround the central inter-wire bond via 302. Further, while two peripheral inter-wire bond vias 304 are shown, more or less peripheral inter-wire bond vias are amenable in alternative embodiments. As above, an area occupied by the inter-wire bond vias 112b in FIG. 4 may be a high percentage of the area occupied by the bond wire 110b in FIG. 4, such that density of the inter-wire bond vias 112b is high. In some embodiments, the width $W_v$ of the peripheral inter-wire bond vias 304 is about 2 micrometers, the spacing $S_v$ is about 2 micrometers, and the high percentage and the high density are about 52 percent. In other embodiments, the width $W_v$, the spacing $S_v$, the high percentage, the high density, or any combination of the foregoing has/have other values.

Figure 5:
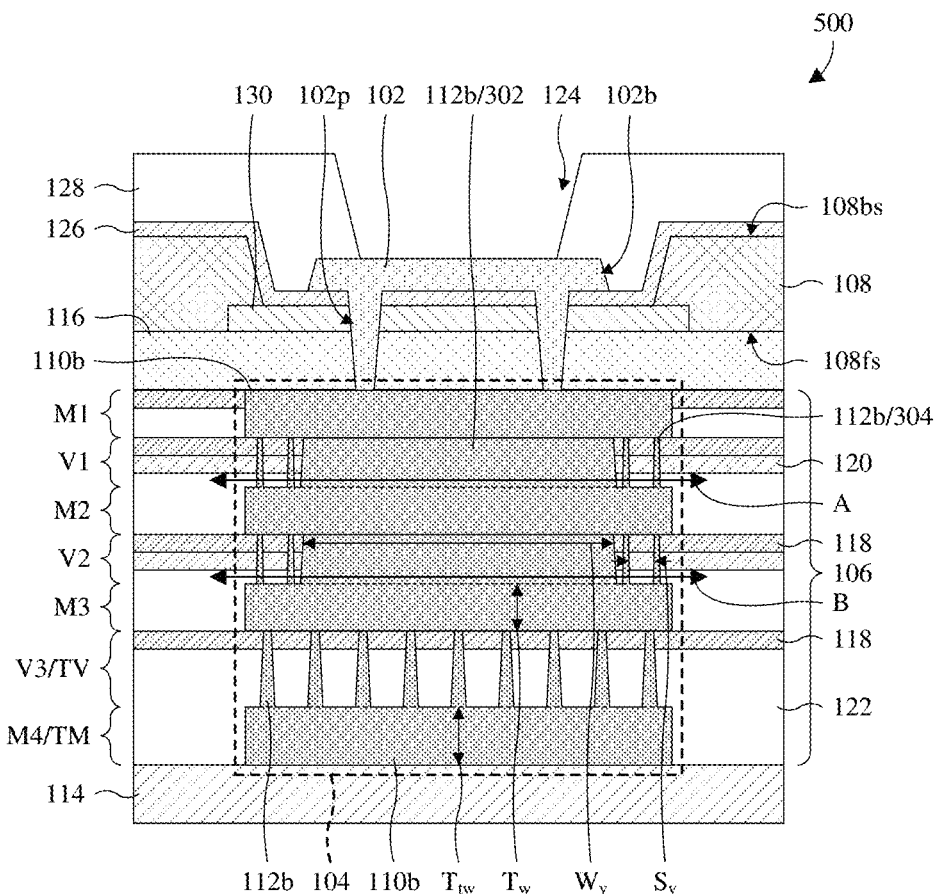
FIG. 5 illustrates a cross-sectional view of some alternative embodiments of the IC chip of FIG. 3 in which a layout of the columnar structure is varied.

With reference to FIG. 5, a cross-sectional view 500 of some alternative embodiments of the IC chip of FIG. 3 is provided in which the width $W_v$ and the spacing $S_v$ are varied amongst the inter-wire bond vias 112b.

Figure 6:
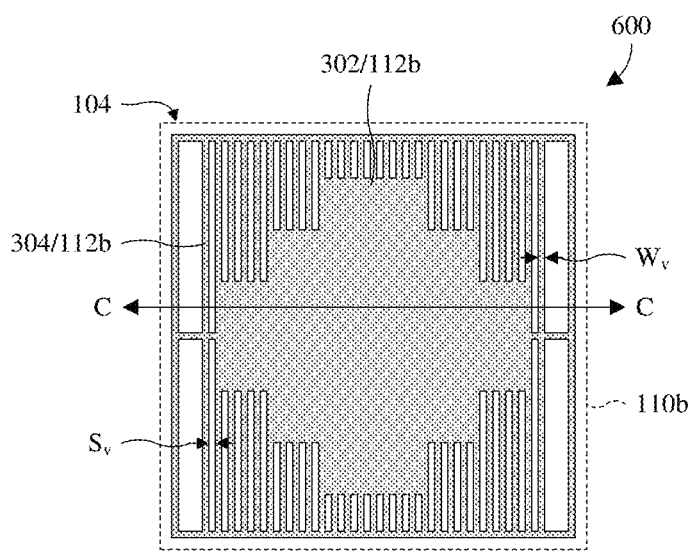
FIG. 6 illustrates a top layout view of some embodiments of a level of inter-wire bond vias forming the columnar structure of FIG. 5.

With reference to FIG. 6, a top layout view 600 of some embodiments of a level of inter-wire bond vias 112b forming the columnar structure 104 of FIG. 5 is provided. The top layout view may, for example, be taken along line A and/or line B in FIG. 5, and/or the cross-sectional view 500 of FIG. 5 may, for example, be taken along line C in FIG. 6. The level of inter-wire bond vias 112b includes a single inter-wire bond via 112b that has a layout of a wafer acceptance test (WAT) pad, whereby the inter-wire bond vias 112b of FIG. 5 correspond to different regions of the single inter-wire bond via 112b.

An area occupied by the inter-wire bond via 112b in FIG. 6 may be a high percentage of the area occupied by the bond wire 110b in FIG. 6, such that density of the inter-wire bond via 112b may be high. In some embodiments, the width $W_v$ of the inter-wire bond via 112b is about 1 micrometer, and/or the high percentage and the high density are about 63 percent. In other embodiments, the width $W_v$, the high percentage, the high density, or any combination of the foregoing has/have other values.

Figure 7:
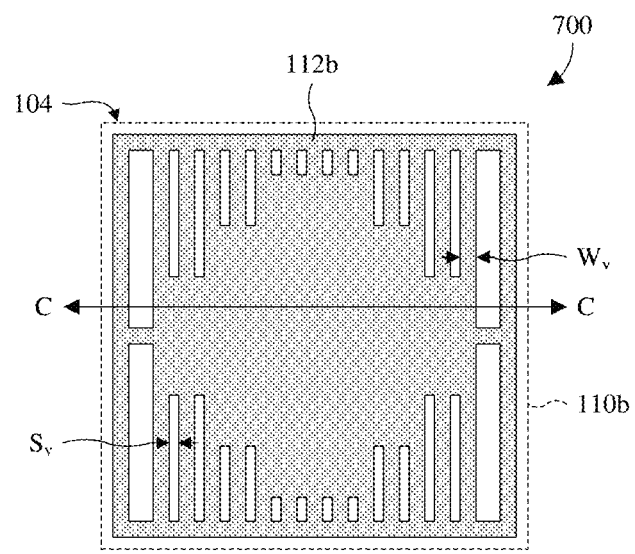
FIG. 7 illustrates a top layout view of some alternative embodiments of the level of inter-wire bond vias of FIG. 6.

With reference to FIG. 7, a top layout view 700 of some alterative embodiments of the level of inter-wire bond vias 112b of FIG. 6 is provided in which the single inter-wire bond via 112b has a layout of a different WAT pad. As above, an area occupied by the inter-wire bond via 112b in FIG. 7 may be a high percentage of the area occupied by the bond wire 110b in FIG. 7, such that density of the inter-wire bond via 112b may be high. In some embodiments, the width $W_v$ of the inter-wire bond via 112b is about 3 micrometers, and/or the high percentage and the high density are about 72 percent. In other embodiments, the width $W_v$, the high percentage, the high density, or any combination of the foregoing has/have other values.

Figure 8:
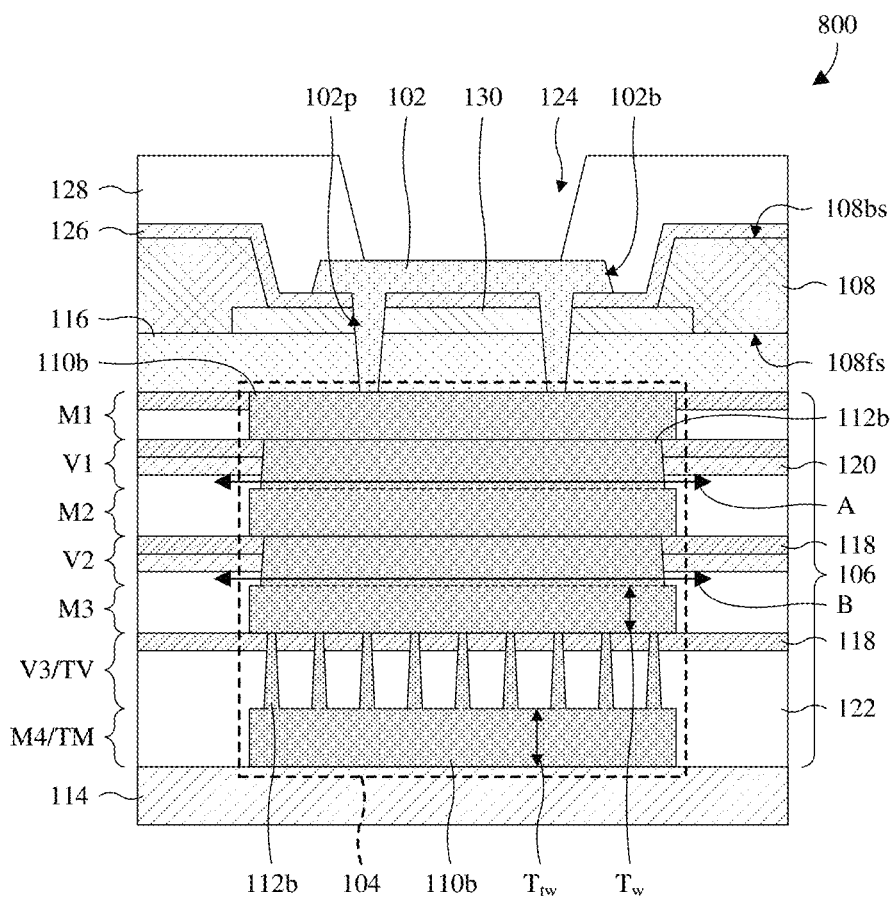
FIG. 8 illustrates a cross-sectional view of some alternative embodiments of the IC chip of FIG. 1 in which a layout of the columnar structure is varied.

With reference to FIG. 8, a cross-sectional view 800 of some alternative embodiments of the IC chip of FIG. 1 is provided in which a layout of the columnar structure 104 is varied. Each via level V1, V2 between the semiconductor substrate 108 and the top via level TV has a single, large inter-wire bond via 112b in the cross-sectional view 800.

Figure 9A:
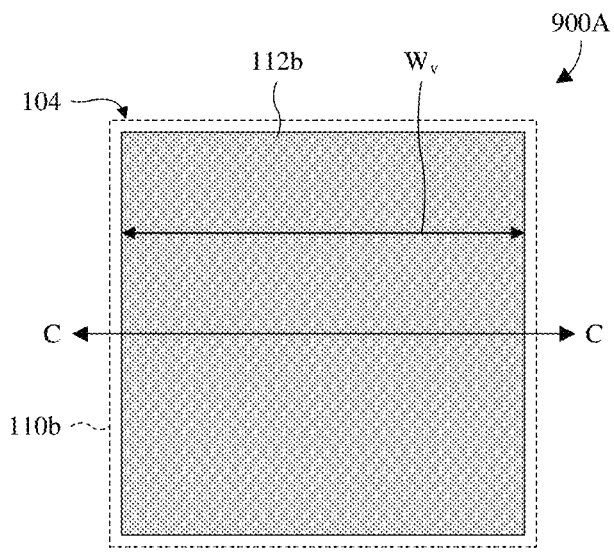
FIGS. 9A and 9B illustrate top layout views of some embodiments of a level of inter-wire bond vias forming the columnar structure of FIG. 8.
Figure 9B:
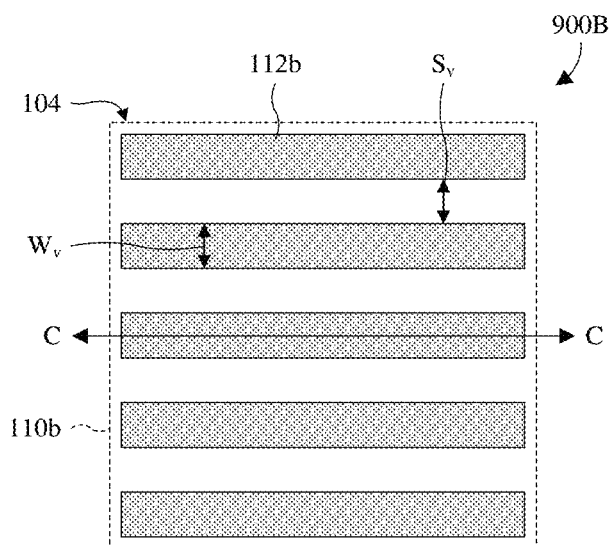

With reference to FIGS. 9A and 9B, top layout views 900A, 900B of some embodiments of a level of inter-wire bond vias 112b forming the columnar structure 104 of FIG. 8 is provided. The top layout views 900A, 900B are alternatives of each other and may, for example, be taken along line A and/or line B in FIG. 8, and/or the cross-sectional view 800 of FIG. 8 may, for example, be taken along line C in FIGS. 9A and 9B.

In FIG. 9A, the level of inter-wire bond vias 112b has only one inter-wire bond via 112b forming the columnar structure 104. Further, the inter-wire bond via 112b has a square or rectangular layout. In alternative embodiments, the inter-wire bond via 112b has a circular layout, a triangular layout, or some other suitable layout.

An area occupied by the inter-wire bond via 112b in FIG. 9A may be a high percentage of the area occupied by the bond wire 110b in FIG. 9A, such that density of the inter-wire bond via 112b is high. In some embodiments, the width $W_v$ of the inter-wire bond via 112b is about 3 micrometers, and/or the high percentage and the high density are about 87%. In other embodiments, the width $W_v$ is about 1 micrometer, and/or the high percentage and the high density are about 96%. In other embodiments, the width $W_v$, the high percentage, the high density, or any combination of the foregoing has/have other values.

In FIG. 9B, the inter-wire bond vias 112b have a plurality of inter-wire bond vias 112b that are line-shaped and elongated laterally in parallel. While five inter-wire bond vias 112b are shown, more or less inter-wire bond vias 112b are amenable.

An area occupied by the inter-wire bond vias 112b in FIG. 9B may be a high percentage of the area occupied by the bond wire 110b in FIG. 9B, such that density of the inter-wire bond vias 112b may be high. In some embodiments, the width $W_v$ of the inter-wire bond vias 112b is about 2 micrometers, the spacing $S_v$ between the inter-wire bond vias 112b is about 1 micrometer, and the high percentage and the high density are about 64 percent. In other embodiments, the width $W_v$ of the inter-wire bond vias 112b is about 1 micrometer, the spacing $S_v$ between the inter-wire bond vias 112b is about 1 micrometer, and the high percentage and the high density are about 47 percent. In other embodiments, the width $W_v$, the spacing $S_v$, the high percentage, the high density, or any combination of the foregoing has/have other values.

Figure 10:
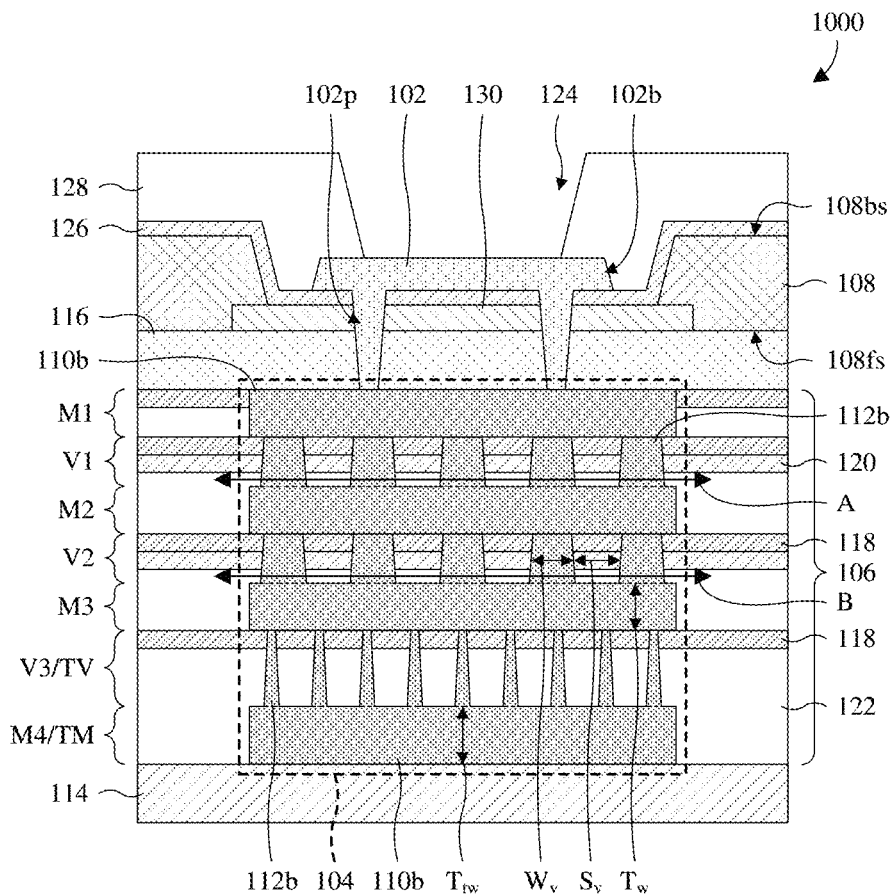
FIG. 10 illustrates a cross-sectional view of some alternative embodiments of the IC chip of FIG. 1 in which a layout of the columnar structure is varied.

With reference to FIG. 10, a cross-sectional view 1000 of some alternative embodiments of the IC chip of FIG. 1 is provided in which a layout of the columnar structure 104 is varied. Each via level V1, V2 between the semiconductor substrate 108 and the top via level TV has fewer inter-wire bond vias 112b than at the top via level TV. Further, the inter-wire bond vias 112b at the via level V1, V2 between the semiconductor substrate 108 and the top via level TV have increased widths $W_v$ compared to the inter-wire bond vias 112b at the top via level TV.

Figure 11A:
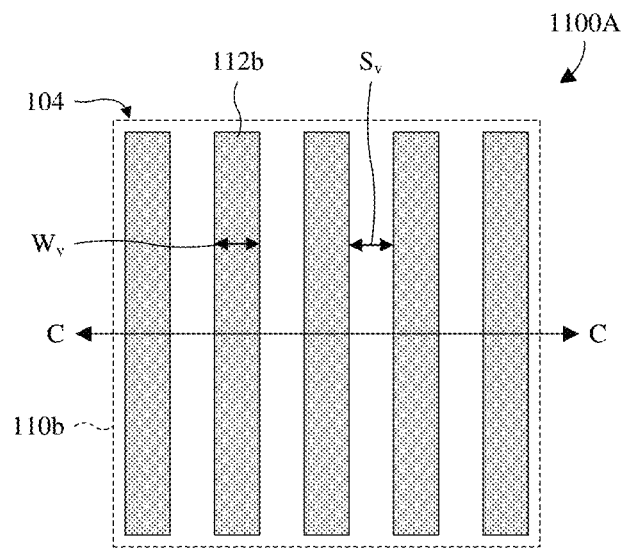
FIGS. 11A and 11B illustrate top layout views of some embodiments of a level of inter-wire bond vias forming the columnar structure of FIG. 10.
Figure 11B:
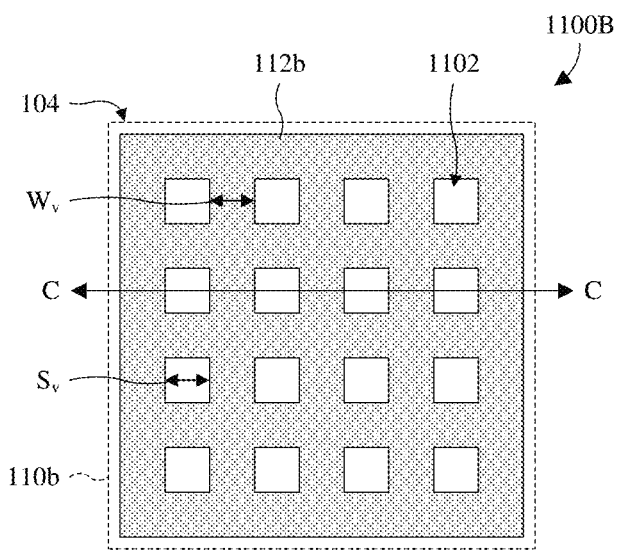

With reference to FIGS. 11A and 11B, top layout views 1100A, 1100B of some embodiments of a level of inter-wire bond vias 112b forming the columnar structure 104 of FIG. 10 is provided. The top layout views 1100A, 1100B are alternatives of each other and may, for example, be taken along line A and/or line B in FIG. 10, and/or the cross-sectional view 1000 of FIG. 10 may, for example, be taken along line C in FIGS. 11A and 11B.

In FIG. 11A, the inter-wire bond vias 112b have a plurality of inter-wire bond vias 112b that are line-shaped and elongated vertically in parallel. While five inter-wire bond vias 112b are shown, more or less inter-wire bond vias 112b are amenable.

An area occupied by the inter-wire bond vias 112b in FIG. 11A may be a high percentage of the area occupied by the bond wire 110b in FIG. 11A, such that density of the inter-wire bond vias 112b may be high. In some embodiments, the width $W_v$ of the inter-wire bond vias 112b is about 2 micrometers, the spacing $S_v$ between the inter-wire bond vias 112b is about 1 micrometer, and the high percentage and the high density are about 63 percent. In other embodiments, the width $W_v$ of the inter-wire bond vias 112b is about 1 micrometer, the spacing $S_v$ between the inter-wire bond vias 112b is about 1 micrometer, and the high percentage and the high density are about 48 percent. In other embodiments, the width $W_v$, the spacing $S_v$, the high percentage, the high density, or any combination of the foregoing has/have other values.

In FIG. 11B, a single inter-wire bond via 112b has a grid or mesh shape surrounding and separating a plurality of openings 1102 in a plurality of rows and a plurality of columns. Further, the inter-wire bond vias 112b of FIG. 10 correspond to different regions of the single inter-wire bond via 112b. While four columns and four rows are illustrated, more or less rows and/or more or less columns are amenable in alternative embodiments.

An area occupied by the inter-wire bond via 112b in FIG. 11B may be a high percentage of the area occupied by the bond wire 110b in FIG. 11B, such that density of the inter-wire bond vias 112b may be high. In some embodiments, the width $W_v$ of the inter-wire bond via 112b is about 2 micrometers, the spacing $S_v$ between segments of the inter-wire bond via 112b is about 2 micrometers, and the high percentage and the high density are about 67 percent. In other embodiments, the width $W_v$, the spacing $S_v$, the high percentage, the high density, or any combination of the foregoing has/have other values.

Figure 12:
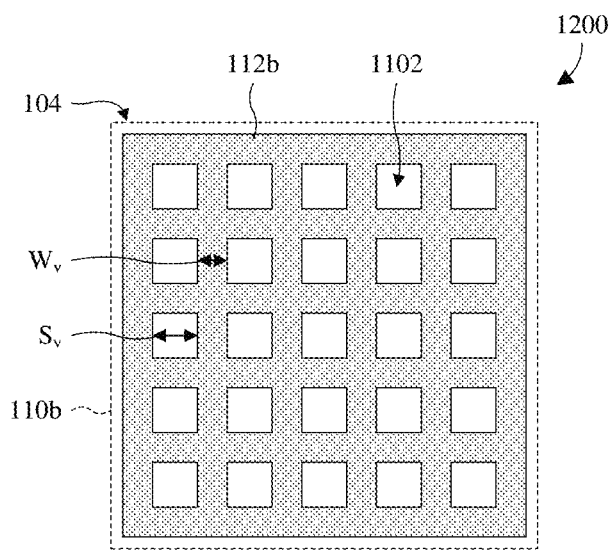
FIG. 12 illustrates a top layout view of some alternative embodiments of the level of inter-wire bond vias of FIG. 11B.

With reference to FIG. 12, a top layout view 1200 of some alterative embodiments of the level of inter-wire bond vias 112b of FIG. 11B is provided in which the plurality of openings 1102 have an additional row and an additional column. An area occupied by the inter-wire bond via 112b in FIG. 12 may be a high percentage of the area occupied by the bond wire 110b in FIG. 12, such that density of the inter-wire bond vias 112b may be high. In some embodiments, the width $W_v$ of the inter-wire bond via 112b is about 2 micrometers, the spacing $S_v$ between segments of the inter-wire bond via 112b is about 3 micrometers, and the high percentage and the high density are about 57 percent. In other embodiments, the width $W_v$, the spacing $S_v$, the high percentage, the high density, or any combination of the foregoing has/have other values.

Figure 13:
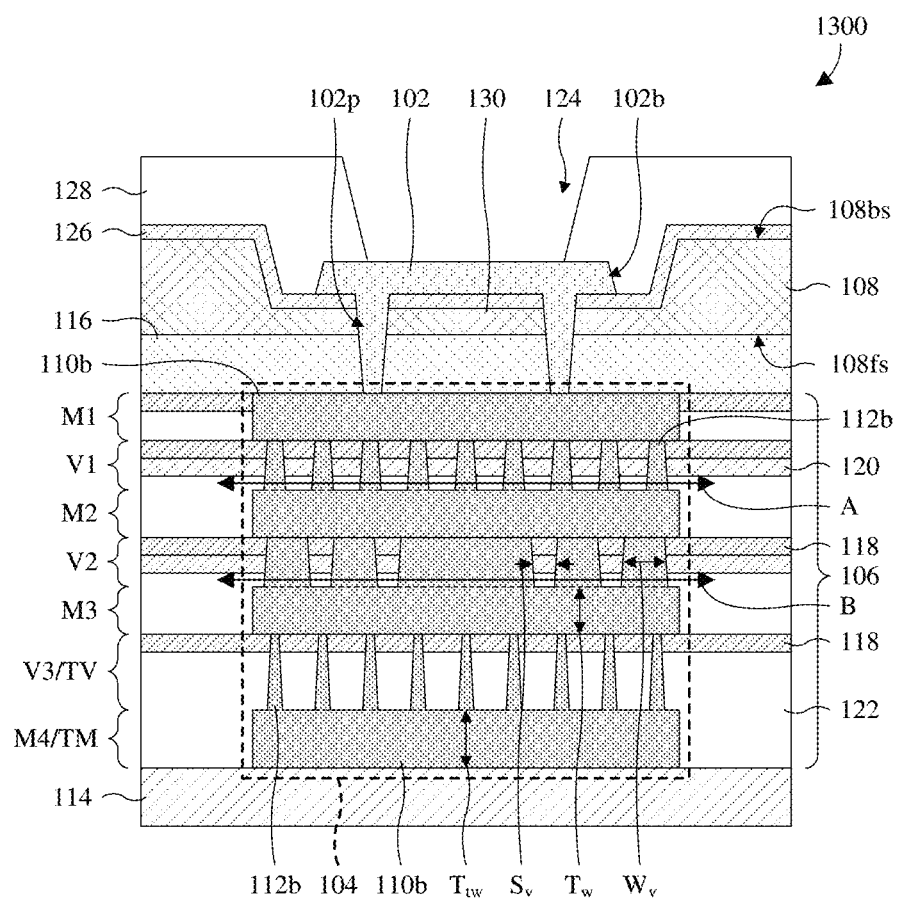
FIG. 13 illustrates a cross-sectional view of some alternative embodiments of the IC chip of FIG. 1 in which a layout of the columnar structure is varied.

With reference to FIG. 13, a cross-sectional view 1300 of some alternative of the IC of FIG. 1 is provided in which a layout of the columnar structure 104 is varied. The inter-wire bond vias 112b at the first via level V1 have a different layout than inter-wire bond vias 112b at a second via level V2. For example, the inter-wire bond vias 112b at the first via level V1 may be as shown in FIG. 2, whereas the inter-wire bond vias 112b at the second via level V2 may be as shown in FIG. 4. In other words, the top layout view 200 of FIG. 2 may, for example, be taken along line A, whereas the top layout view 400 of FIG. 4 may, for example, be taken along line B. In alternative embodiments, the inter-wire bond vias 112b at the first via level V1 have a layout as in any one or combination of FIGS. 5, 6, 7, 8, 9A, 9B, 10, 11A, 11B, and 12, and/or the inter-wire bond vias 112b at the second inter-wire level V2 have a layout as in any one or combination of FIGS. 5, 6, 7, 8, 9A, 9B, 10, 11A, 11B, and 12.

Figure 14:
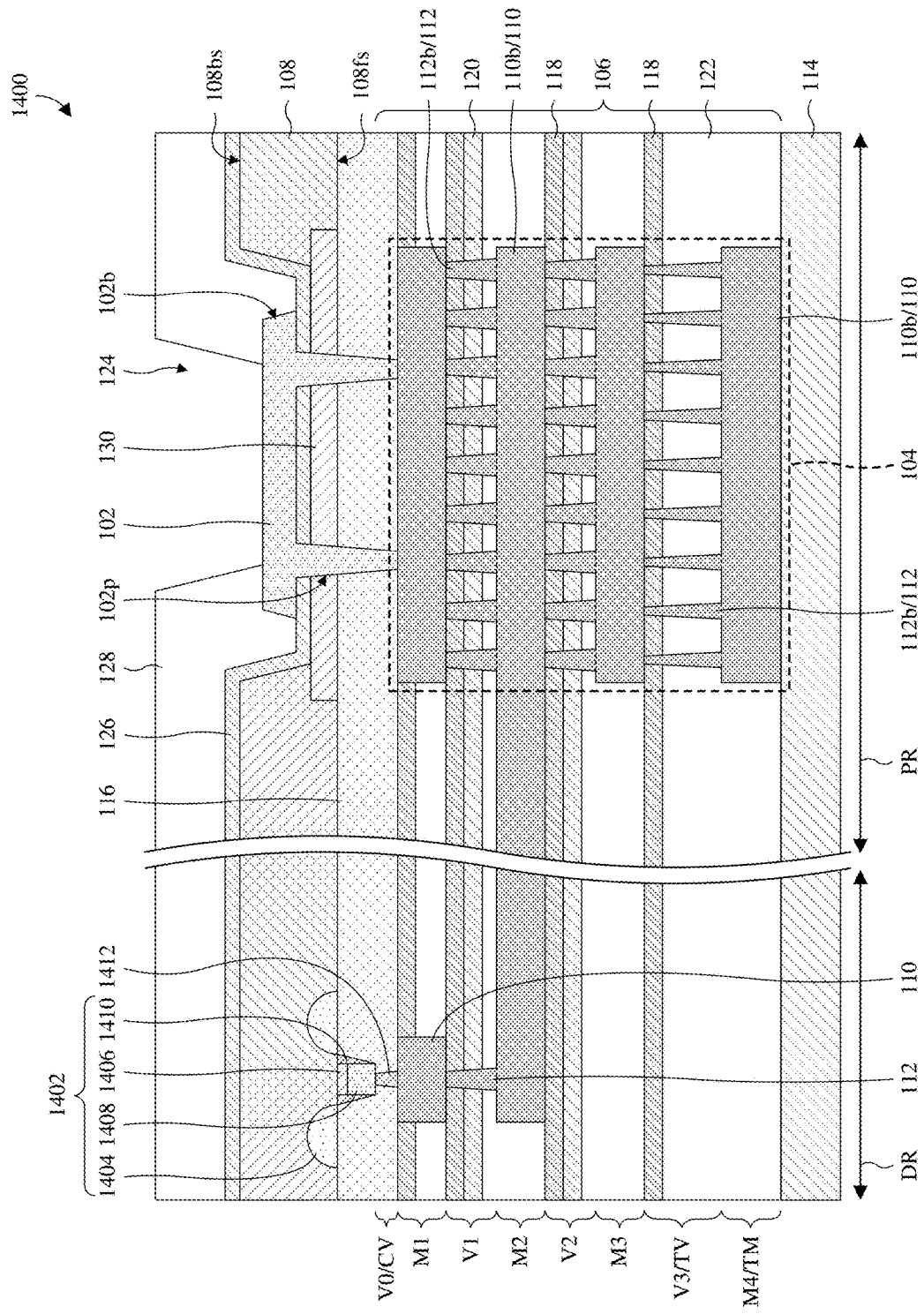
FIG. 14 illustrates a cross-sectional view of some alternative embodiments of the IC chip of FIG. 1 in which the IC chip further comprises a semiconductor device.

With reference to FIG. 14, a cross-sectional view 1400 of some alternative of the IC of FIG. 1 is provided in which the IC chip further comprises a semiconductor device 1402. The semiconductor device 1402 is at a device region DR of the IC chip, whereas the bond pad structure 102 and the columnar structure 104 are at a peripheral region PR of the IC chip.

The semiconductor device 1402 comprises a pair of source/drain regions 1404, a gate dielectric layer 1406, a gate electrode 1408, and a sidewall spacer structure 1410. The source/drain regions 1404 are inset into the frontside 108fs of the semiconductor substrate 108 and, in some embodiments, corresponds to doped regions of the semiconductor substrate 108. The gate dielectric layer 1406 and the gate electrode 1408 are vertically stacked on the frontside 108fs of the semiconductor substrate 108 to form a gate stack, and the gate stack is sandwiched laterally between the source/drain regions 1404. The sidewall spacer structure 1410 is on sidewalls of the gate stack. The semiconductor device 1402 may, for example, be an insulated-gate field-effect transistor (IGFET) or some other suitable type of semiconductor device. Further, while not illustrated as such, the semiconductor device 1402 may alternatively be a fin field-effect transistor (finFET), a gate-all-around field-effect transistor (GAAFET), a nano-sheet field-effect transistor (FET), or some other suitable type of transistor.

The interconnect structure 106 electrically couples the semiconductor device 1402 to the columnar structure 104 with the bond wire 110b at the second wire level M2. In alternative embodiments, the interconnect structure 106 electrically couples the semiconductor device 1402 to the columnar structure 104 with the bond wire 110b at the first wire level M1 or some other suitable wire level instead of with the bond wire 110b at the second wire level M2. The interconnect structure 106 comprises a plurality of wires 110, a plurality of inter-wire vias 112, and a plurality of contact vias 1412 (only one of which is illustrated).

The plurality of wires 110 include the bond wires 110b, and the plurality of inter-wire vias 112 include the inter-wire bond vias 112b. As should be appreciated, the bond wires 110b and the inter-wire bond vias 112b correspond to wires and vias that form the columnar structure 104 to which the bond pad structure 102 extends. Wires and vias that do not form the columnar structure 104 are not characterized as bond wires and bond vias. The wires 110 and/or the inter-wire vias 112 may, for example, be or comprise copper, aluminum, aluminum copper, some other suitable metal(s), or any combination of the foregoing. The contact vias 1412 may, for example, be or comprise tungsten and/or some other suitable metal(s).

The wires 110 and the inter-wire vias 112 are distributed respectively amongst the wire levels M1-M4 and the via levels V1-V3 as described with regard to FIG. 1. Further, the contact vias 1412 form a contact via level CV, which may also be referred a zeroth via level V0. The contact via level CV is between the first wire level M1 and the semiconductor substrate 108, and electrically couples the first wire level M1 to the semiconductor device 1402.

As above, the inter-wire bond vias 112b between the top via level TV and the semiconductor substrate 108 have a high density. Further, in some embodiments, the inter-wire bond vias 112b at the top via level TV have the high density. Via density is determined per via level and corresponds to a ratio of via area to wire area respectively for the inter-wire bond vias 112b at a given via level and an adjoining bond wire. To the extent that the adjoining bond wire extends beyond the columnar structure 104, the wire area excludes the portion of the adjoining bond wire extending beyond the columnar structure 104. The bond wire 110b at the second wire level M2 provides a non-limiting example of such a bond wire.

Figure 15:
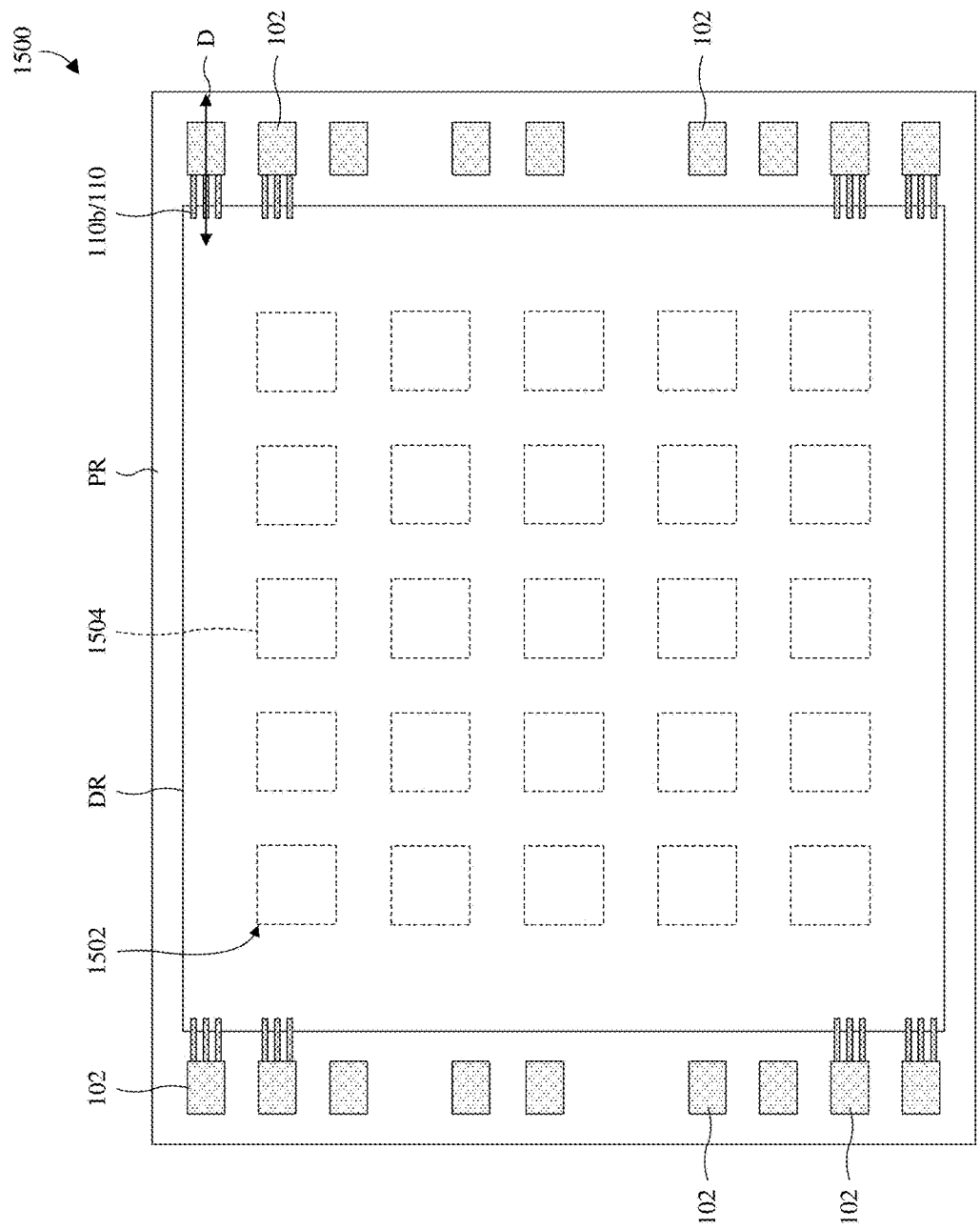
FIG. 15 illustrates a top layout view of some embodiments of the IC chip of FIG. 14.

With reference to FIG. 15, a top layout view 1500 of some embodiments of the IC of FIG. 14 is provided. The cross-sectional view 1400 of FIG. 14 may, for example, be taken along line D but other suitable locations are amenable. The peripheral region PR surrounds the device region DR and accommodates a plurality of bond pad structures 102. Further, at least some of the bond pad structures 102 are electrically coupled to semiconductor devices (not illustrated) in the device region DR. The semiconductor device 1402 of FIG. 14 provides a non-limiting example of such a semiconductor device. Further, the electrical coupling may be achieved through the wires 110 in the second wire level M2 of FIG. 14 or through the wires 110 in the first wire level M1 of FIG. 14, the third wire level M3 of FIG. 14, or any other wire level of FIG. 14.

The device region DR accommodates a pixel array 1502 comprising a plurality of pixel sensors 1504 in a plurality of rows and a plurality of columns. The pixel sensors 1504 may, for example, be or comprise five transistor (5T) active pixel sensors (APSs) or some other suitable type of pixel sensors. Further, while five rows and five columns are illustrated, more or less rows and/or more of less columns are amenable in alternative embodiments. The semiconductor devices in the device region DR to which bond pad structures 102 electrically couple form circuitry supporting operation of the pixel sensors 1504 and/or partially form the pixel sensors 1504. For example, the semiconductor devices may partially form an image signal processor, read/write circuitry, or other suitable circuitry supporting operation of the pixel sensors 1504. In some embodiments, the semiconductor device 1402 of FIG. 14 forms circuitry supporting operation of the pixel sensors 1504. In alternative embodiments, the pixel array 1502 is omitted. In such alternative embodiments, the semiconductor devices in the device region DR to which the bond pad structures 102 electrically couple may form a logic core or the like.

With reference to FIGS. 16A-16D, cross-sectional views 1600A-1600D of some alternative embodiments of the IC chip of FIG. 14 are provided.

Figure 16A:
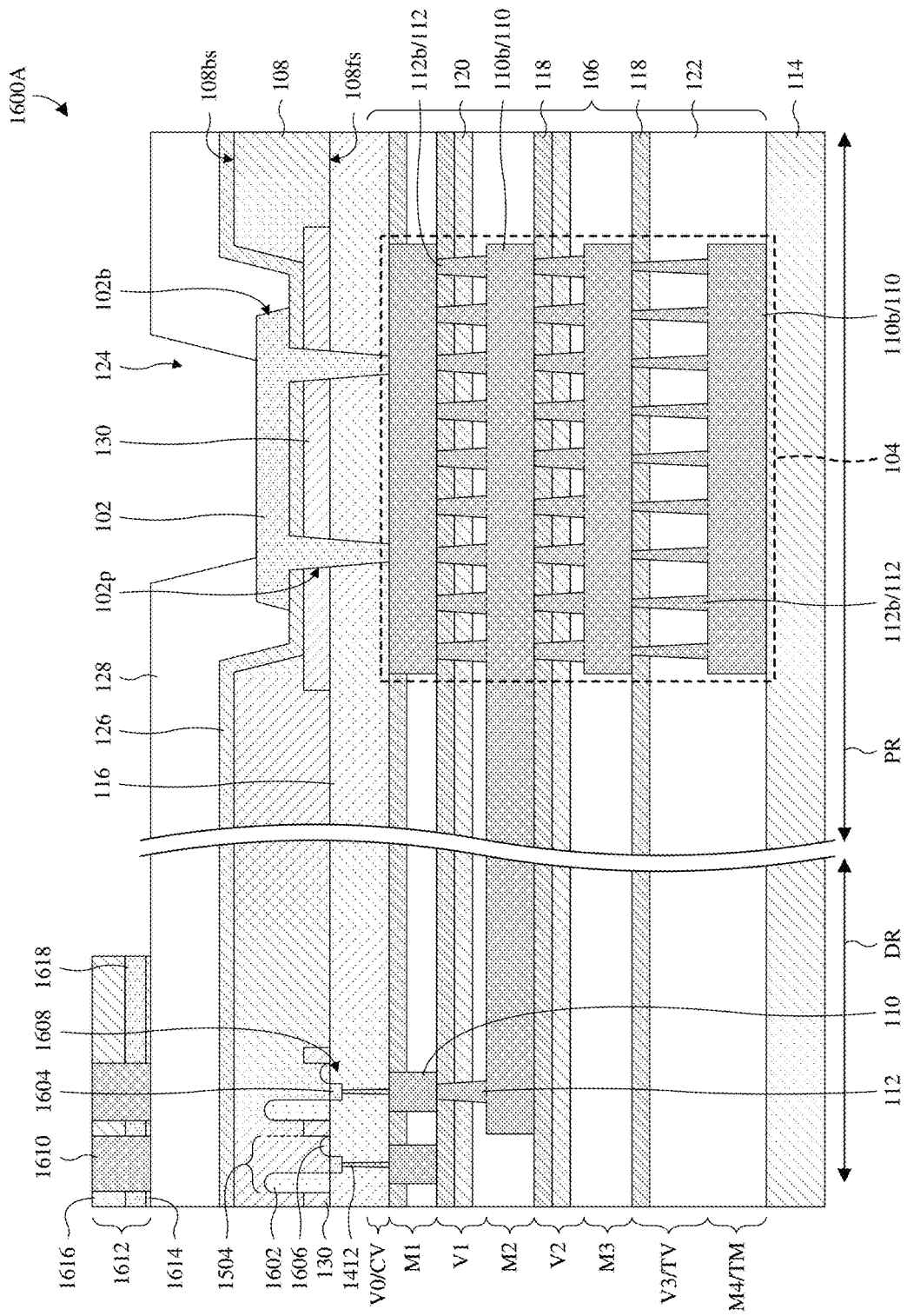
FIGS. 16A-16D illustrate cross-sectional views of some alternative embodiments of the IC chip of FIG. 14.

In FIG. 16A, the device region DR accommodates a plurality of pixel sensors 1504, and the columnar structure 104 electrically couples to a corresponding one of the pixel sensors 1504. The pixel sensors 1504 are separated from each other by the trench isolation structure 130. Further, the pixel sensors 1504 comprise individual photodetectors 1602, individual gate stacks 1604, and individual floating diffusion nodes 1606.

The photodetectors 1602 and the floating diffusion nodes 1606 extend into the frontside 108fs of the semiconductor substrate 108 and correspond to doped regions of the semiconductor substrate 108. For example, the photodetectors 1602 and the floating diffusion nodes 1606 may have an n-type doping, whereas surrounding regions of the semiconductor substrate 108 may have a p-type doping, or vice versa. The gate stacks 1604 are on the frontside 108fs of the semiconductor substrate 108, laterally between a corresponding one of the photodetectors 1602 and a corresponding one of the floating diffusion nodes 1606. The gate stacks 1604 comprise individual gate electrodes and individual gate dielectric layers separating the gate electrodes from the semiconductor substrate 108. The gate dielectric layer 1406 of FIG. 14 and the gate electrode 1408 of FIG. 14 provide non-limiting examples of the gate dielectric layers and the gate electrodes.

During operation of the pixel sensors 1504, carriers collect in the photodetectors 1602. Then when the gate electrode of a gate stack is appropriately biased, the carriers collected in the corresponding photodetector are transferred to the corresponding floating diffusion node. Therefore, the gate stacks 1604 may form transfer transistors 1608. The transfer transistors 1608 may, for example, be IGFETs or some other suitable type of transistor.

A plurality of color filters 1610 and a composite grid 1612 overlie the pixel sensors 1504 on the backside 108bs of the semiconductor substrate 108. The color filters 1610 are inset into the composite grid 1612 and are each configured to pass first wavelengths of radiation while blocking second wavelengths of radiation.

The composite grid 1612 comprises a first grid dielectric layer 1614, a second grid dielectric layer 1616, and a grid metal layer 1618 between the first and second grid dielectric layers 1614, 1616. The grid metal layer 1618 reflects incident radiation to direct the radiation towards the photodetectors 1602. Further, the first and second grid dielectric layers 1614, 1616 have refractive indexes that are less than the color filters 1610 to promote total internal reflection (TIR). Hence, the first and second grid dielectric layers 1614, 1616 may reflect incident radiation by TIR to direct the radiation towards the photodetectors 1602. The aforementioned reflection may, in turn, enhance absorption of radiation received at the IC.

Figure 16B:
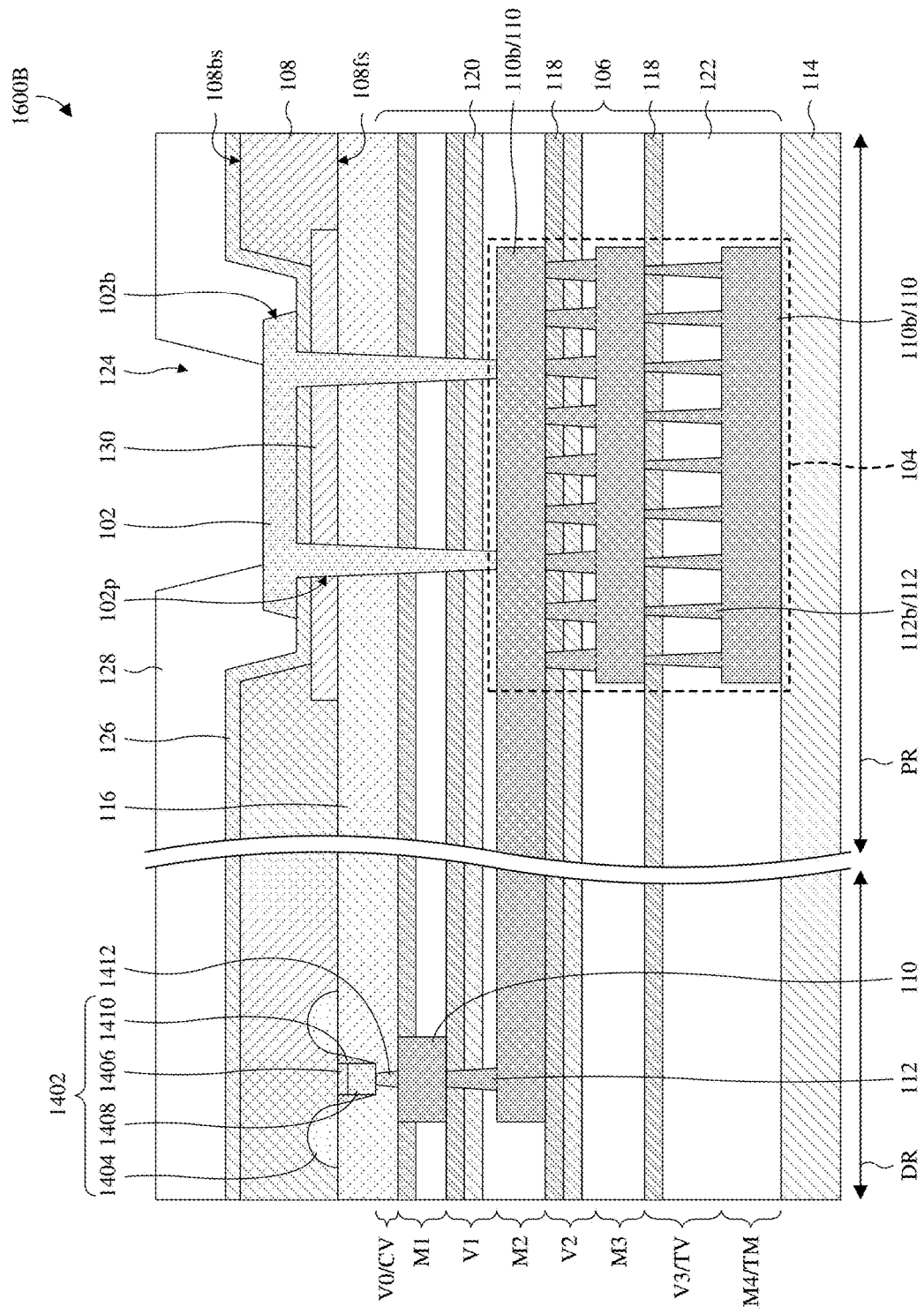

In FIG. 16B, the pad protrusions 102p of the bond pad structure 102 extend to the bond wire 110b in the second wire level M2. In other embodiments, the pad protrusions 102p may extend to the bond wire 110b in any other wire level of the interconnect structure 106.

Figure 16C:
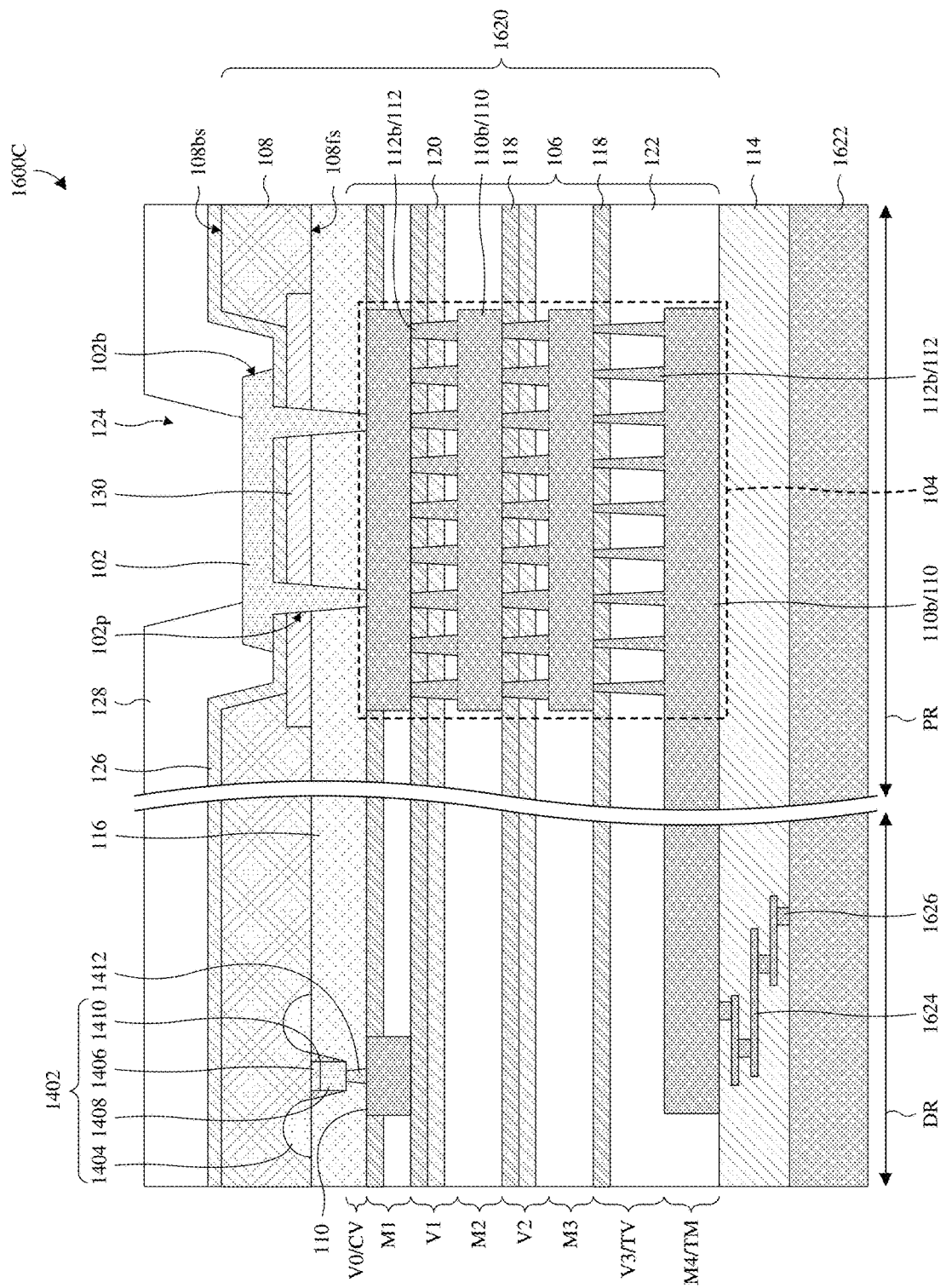

In FIG. 16C, the IC chip is a three-dimensional (3D) IC chip and comprises a first IC chip 1620 and a second IC chip 1622 bonded and electrically coupled together. The semiconductor substrate 108, the semiconductor device 1402, and the interconnect structure 106 at least partially form the first IC chip 1620. The second IC chip 1622 comprises a semiconductor substrate, a plurality of semiconductor devices, and an interconnect structure similar to the first IC chip 1620. However, for ease of illustration, constituents of the second IC chip 1622 are not shown. The second IC chip 1622 may, for example, be an application-specific integrated circuit (ASIC) chip, an embedded memory IC chip, or some other suitable type of IC chip.

The passivation layer 114 is between the first and second IC chips 1620, 1622 and accommodates a plurality of redistribution layers 1624 and a plurality of redistribution vias 1626. The redistribution layers 1624 and the redistribution vias 1626 are alternatingly stacked to electrically couple the first IC chip 1620 to the second IC chip 1622. The redistribution layers 1624 and the redistribution vias 1626 may, for example, be or comprise aluminum, aluminum copper, copper, some other suitable metal(s), or any combination of the foregoing.

Figure 16D:
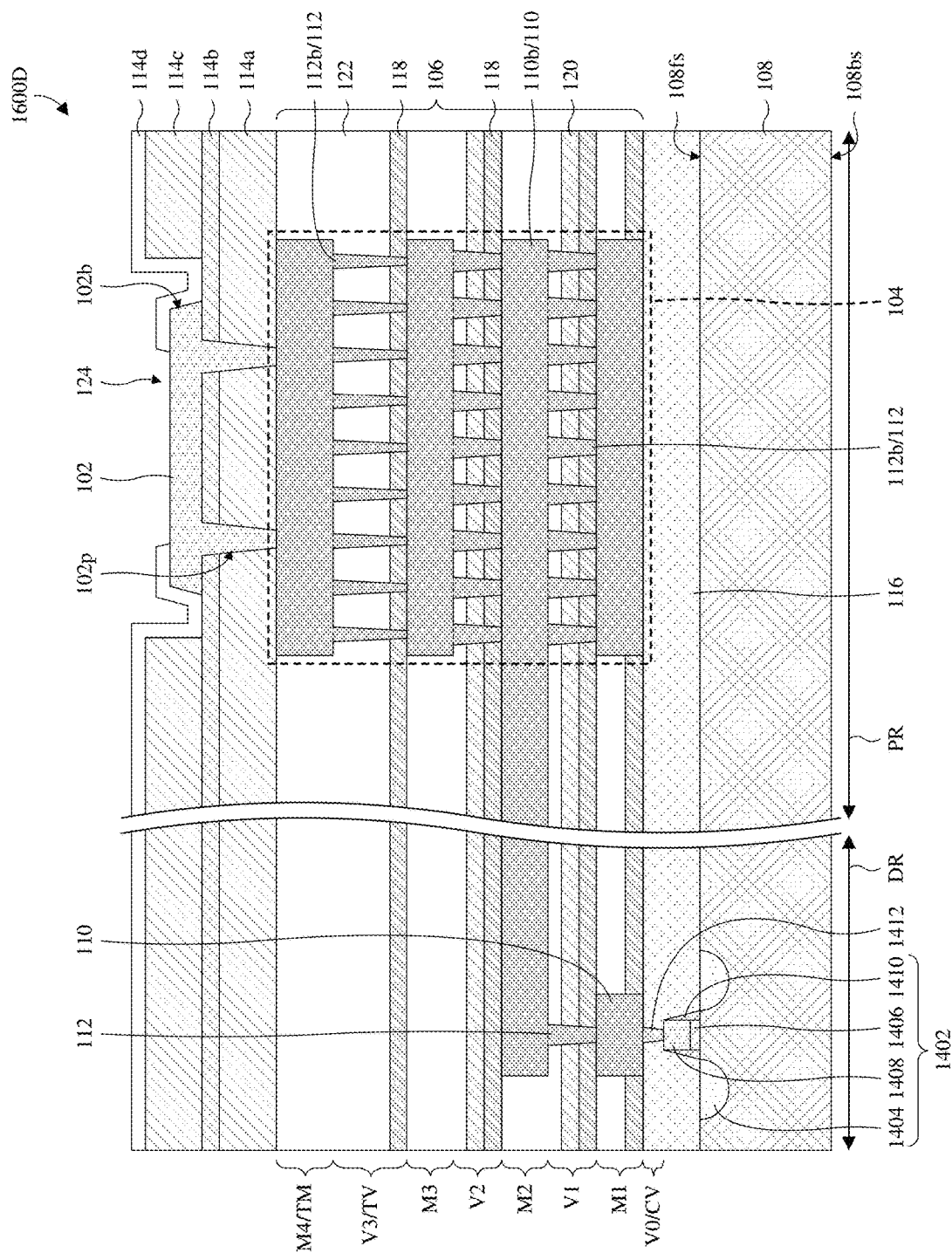

In FIG. 16D, the bond pad structure 102 is separated from the semiconductor substrate 108 on the frontside 108fs of the semiconductor substrate 108 by the interconnect structure 106. Further, the bond pad structure 102 is inset into a plurality of passivation layers 114a-114d.

A first passivation layer 114a and a third passivation layer 114c are vertically stacked with a second passivation layer 114b separating the first and third passivation layers 114a, 114c. In some embodiments, the first and third passivation layers 114a, 114c have a first material, whereas the second passivation layer 114b has a second material different than the first material, such that that the second passivation layer 114b may serve as an etch stop. The first material may be or comprise silicon oxide, whereas the second material may be or comprise silicon nitride, or vice versa. Other suitable materials are, however, amenable. A fourth passivation layer 114d overlies the third passivation layer 114c and the bond pad structure 102 and separates sidewalls of the bond pad structure 102 from the third passivation layer 114c. Further, the fourth passivation layer 114d forms the pad opening 124. The fourth passivation layer 114d may be or comprise silicon oxide and/or some other suitable dielectric(s).

In some embodiments, because the bond pad structure 102 is closest to the top via level TV, the inter-wire bond vias 112b at the top via level TV have a high density. Such a high density increases a strength of the columnar structure 104 and reduces delamination and failure at the columnar structure 104. Further, in some embodiments, the inter-wire bond vias 112b at one, two, or more of the via levels V1-V3 closest to the bond pad structure 102 have a high density so strength of the columnar structure 104 is high proximate the bond pad structure 102. This may, for example, apply to the embodiments of FIG. 16D, as well as to any of the preceding embodiments (e.g., at FIG. 1) and any other suitable embodiments.

While FIGS. 14 and 16A-16D are illustrated using embodiments of the columnar structure 104 and the bond pad structure 102 in FIG. 1, embodiments of the columnar structure 104 and/or the bond pad structure 102 in any of FIGS. 3, 5, 8, 10, and 13 may alternatively be employed. In some embodiments, the inter-wire bond vias 112b at the via levels V1, V2 between the semiconductor substrate 108 and the top via level TV may have a top layout as in FIG. 2. In other embodiments, the inter-wire bond vias 112b at the via levels V1, V2 between the semiconductor substrate 108 and the top via level TV may have a top layout as in any of FIGS. 4, 6, 7, 9A, 9B, 11A, 11B, and 12.

With reference to FIGS. 17-35, a series of cross-sectional views 1700-3500 of some embodiments of a method for forming an IC chip is provided in which a bond pad structure extends to a columnar structure with a high via density. As seen hereafter, the method illustrates formation of the IC of FIG. 14 but may alternatively be employed to form the IC chip in any of FIG. 1, 3, 5, 8, 10, 13, or 16A-16C or to form some other suitable IC chip.

Figure 17:
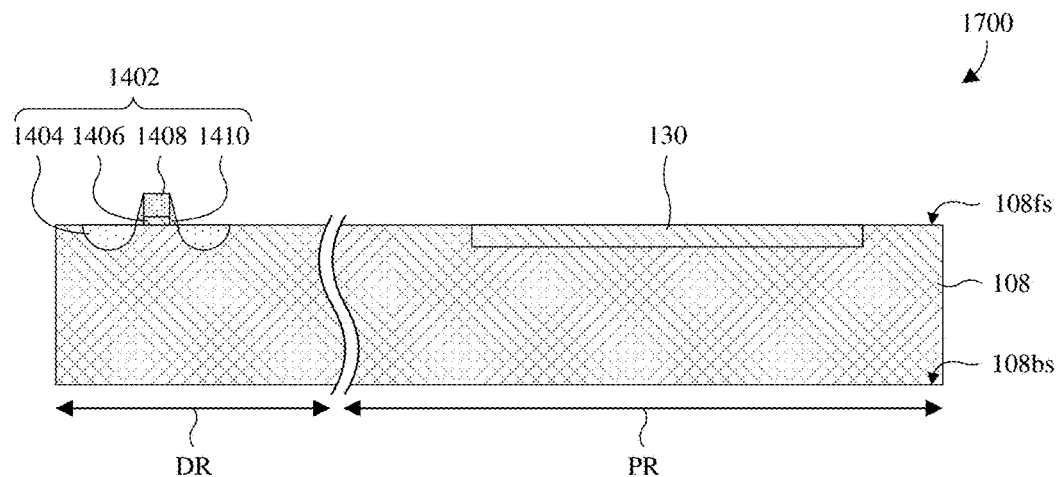
FIGS. 17-35 illustrate a series of cross-sectional views of some embodiments of a method for forming an IC chip in which a bond pad structure extends to a columnar structure with a high via density.

As illustrated by the cross-sectional view 1700 of FIG. 17, a semiconductor device 1402 and a trench isolation structure 130 are formed on a frontside 108fs of a semiconductor substrate 108, opposite a backside 108bs of the semiconductor substrate 108.

The semiconductor device 1402 is formed at a device region DR and comprises a pair of source/drain regions 1404, a gate dielectric layer 1406, a gate electrode 1408, and a sidewall spacer structure 1410. The source/drain regions 1404 are inset into the frontside 108fs of the semiconductor substrate 108 and, in some embodiments, correspond to doped regions of the semiconductor substrate 108. The gate dielectric layer 1406 and the gate electrode 1408 are vertically stacked on the frontside 108fs of the semiconductor substrate 108 to form a gate stack, and the gate stack is sandwiched laterally between the source/drain regions 1404. The sidewall spacer structure 1410 is on sidewalls of the gate stack. The trench isolation structure 130 is formed at a peripheral region PR and is or comprises a dielectric. In some embodiments, the peripheral region PR and the device region DR have a layout as in FIG. 15.

Figure 18:
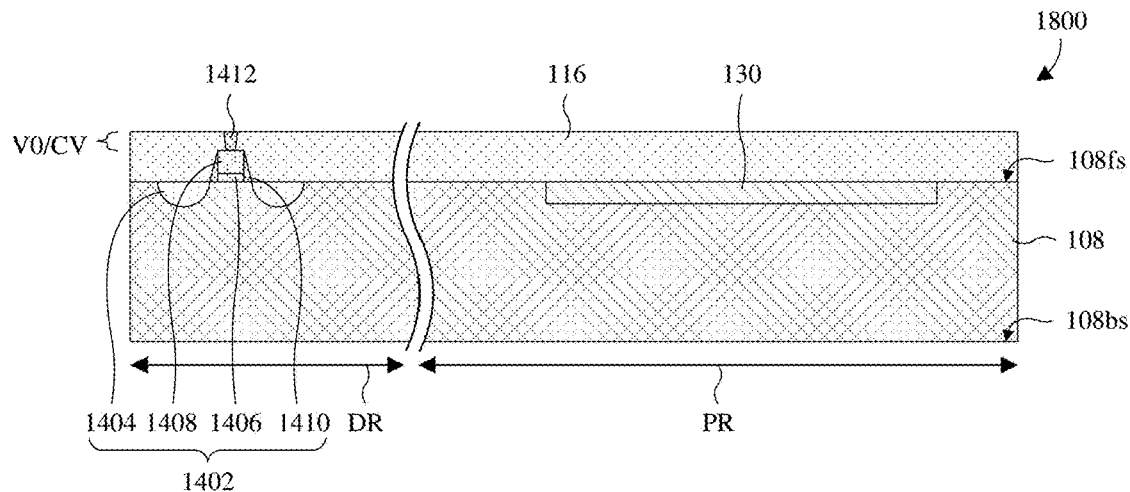

As illustrated by the cross-sectional view 1800 of FIG. 18, an ILD layer 116 is formed covering the frontside 108fs of the semiconductor substrate 108 over the semiconductor device 1402 and the trench isolation structure 130. Further, a plurality of contact vias 1412 (only one of which is shown) are formed. The contact vias 1412 are inset into a top of the ILD layer 116 with individual top surfaces level with a top surface of the ILD layer 116, and at least one of the contact vias 1412 extends from the semiconductor device 1402. Further, the contact vias 1412 form a contact via level CV, which may also be referred a zeroth via level V0.

Figure 19:
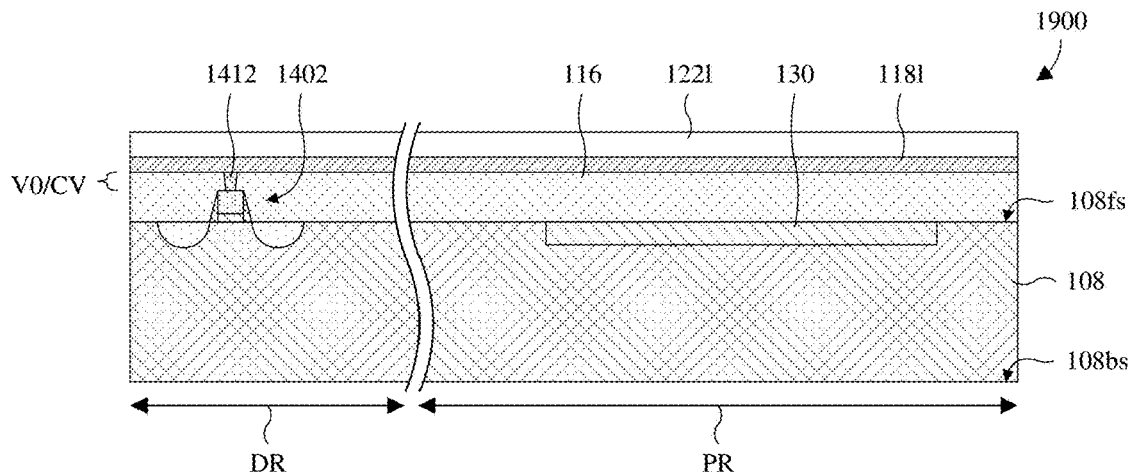

As illustrated by the cross-sectional view 1900 of FIG. 19, a lower ESL 118l is formed over the ILD layer 116 and the contact via level CV. Further, a lower IMD layer 122l is formed over the lower ESL 118. The layers may, for example, be formed by chemical vapor deposition (CVD), physical vapor deposition (PVD), atomic layer deposition (ALD), some other suitable deposition process(es), or any combination of the foregoing.

Figure 20:
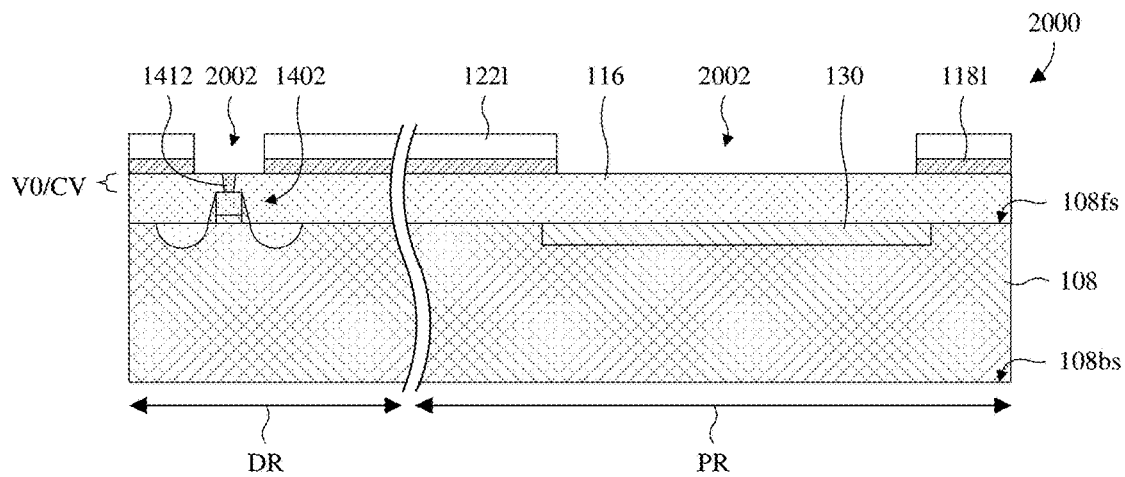

As illustrated by the cross-sectional view 2000 of FIG. 20, the lower ESL 118l and the lower IMD layer 122l are patterned to form a plurality of wire openings 2002. Amongst the plurality of wire openings 2002, one of the wire openings 2002 overlies and exposes the contact via 1412 at the semiconductor device 1402 and another one of the wire openings 2002 overlies the trench isolation structure 130. A process for performing the patterning may, for example, comprise: 1) forming a mask over the lower IMD layer 122l, and with a layout of the wire openings 2002, using photolithography; 2) performing a first etch into the lower IMD layer 122l with the mask in the place, and stopping on the lower ESL 118l, to form the wire openings 2002; 3) performing a second etch into the lower ESL 118l to extend the wire openings 2002 through the lower ESL 118l; and 4) removing the mask. Other suitable processes are, however, amenable.

Figure 21:
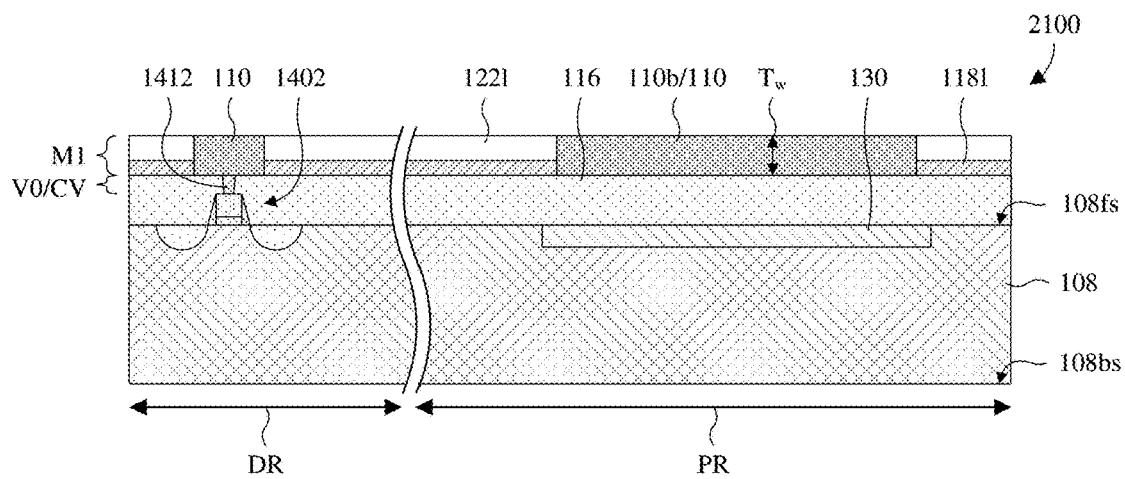

As illustrated by the cross-sectional view 2100 of FIG. 21, a plurality of wires 110 is formed respectively filling the wire openings 2002 and forming a first wire level M1. Further, the wires 110 include a bond wire 110b overlying the trench isolation structure 130 at the peripheral region PR. In some embodiments, a thickness $T_w$ of the wires 110 is small. A small thickness may, for example, be a thickness less than about 1000 angstroms, about 800 angstroms, or some other suitable value. A process for forming the wires 110 may, for example, comprise: 1) depositing a metal layer covering the lower IMD layer 122l and filling the wire openings 2002; and 2) performing a planarization into the metal layer until a top surface of the metal layer is level with that of the lower IMD layer 122l. Other suitable processes are, however, amenable.

Figure 22:
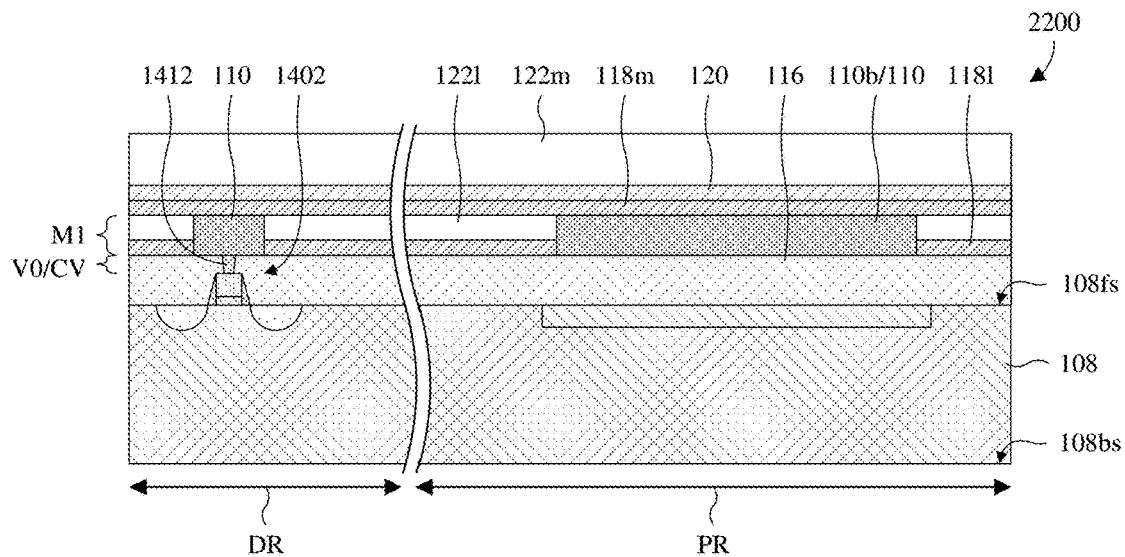

As illustrated by the cross-sectional view 2200 of FIG. 22, a middle ESL 118m, a buffer layer 120, and a middle IMD layer 122m are formed stacked over the wires 110. The buffer layer 120 overlies the middle ESL 118m, and the middle IMD layer 122m overlies the buffer layer 120.

The layers may, for example, be formed by CVD, PVD, ALD, some other suitable deposition process(es), or any combination of the foregoing.

Figure 23:
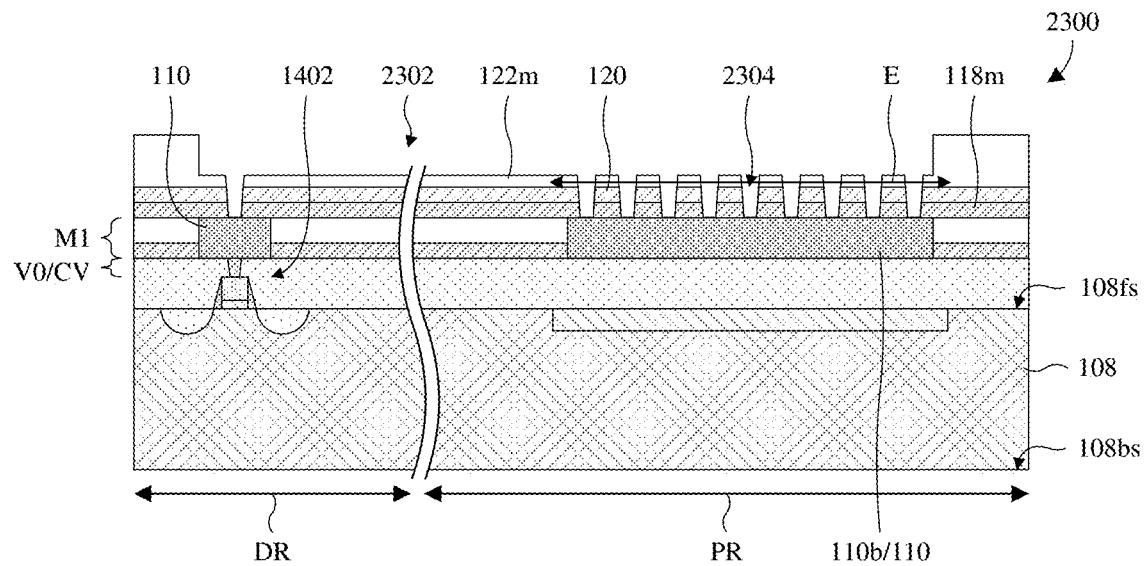

As illustrated by the cross-sectional view 2300 of FIG. 23, the middle ESL 118m, the buffer layer 120, and the middle IMD layer 122m are patterned to form a plurality of wire openings 2302 (only one of which is shown) and a plurality of via openings 2304. The via openings 2304 are between the wire openings 2302 and the wires 110 at the first wire level M1. Further, the via openings 2304 extend respectively from the wire openings 2302 respectively to the wires 110 at the first wire level M1. The via openings 2304 at the peripheral region PR have a high density, such that vias hereafter formed in the via openings 2304 at the peripheral region PR have a high density. High density may, for example, be a density greater than about 10%, about 20%, about 40%, or about 80% and/or a density of about 10%-30%, about 30%-50%, about 50%-80%, or about 80-99%. Other suitable values are, however, amenable.

Density of the via openings 2304 at the peripheral region PR is determined per via level and corresponds to a ratio of via area to wire area respectively for the via openings 2304 and the bond wire 110b at the first wire level M1. The via area may, for example, correspond to a top layout area of the via openings 2304, and the wire area may, for example, correspond to a top layout area of the bond wire 110b. Hence, a high density is a high ratio of the via area to the wire area. Put another way, a high density arises when the via area is a high percentage of the wire area. As described hereafter, the high density reduces peeling and hence failure from shear force applied to a bond pad structure hereafter formed.

In some embodiments, a top layout of the via openings 2304 at the peripheral region PR and a top layout of the bond wire 110b at the peripheral region PR are respectively as a top layout of the inter-wire bond vias 112b in FIG. 2 and a top layout of the bond wire 110b in FIG. 2. For example, FIG. 2 may be taken along line E. In alternative embodiments, a cross-sectional layout of the via openings 2304 at the peripheral region PR is as in any of FIGS. 3, 5, 8, 10, and 13. Further, in alternative embodiments, a top layout of the via openings 2304 at the peripheral region PR and a top layout of the bond wire 110b at the peripheral region PR are respectively as a top layout of the inter-wire bond vias 112b in any of FIGS. 4, 6, 7, 9A, 9B, 11A, 11B, and 12 and a top layout of the bond wire 110b in any of FIGS. 4, 6, 7, 9A, 9B, 11A, 11B, and 12.

A process for performing the patterning may, for example, comprise: 1) forming a first mask over the middle IMD layer 122m, and with a layout of the via openings 2304, using photolithography; 2) performing a first etch into the middle IMD layer 122m and the buffer layer 120 with the first mask in the place, and stopping on the middle ESL 118m, to form the via openings 2304; 3) performing a second etch into the middle ESL 118m to extend the via openings 2304 through the middle ESL 118m; 4) replacing the first mask with a second mask that has a layout of the wire openings 2302 using photolithography; 5) performing a third etch into the middle IMD layer 122m, and stopping before the buffer layer 120, to form the wire openings 2302; and 6) removing the second mask. Other suitable processes are, however, amenable.

Figure 24:
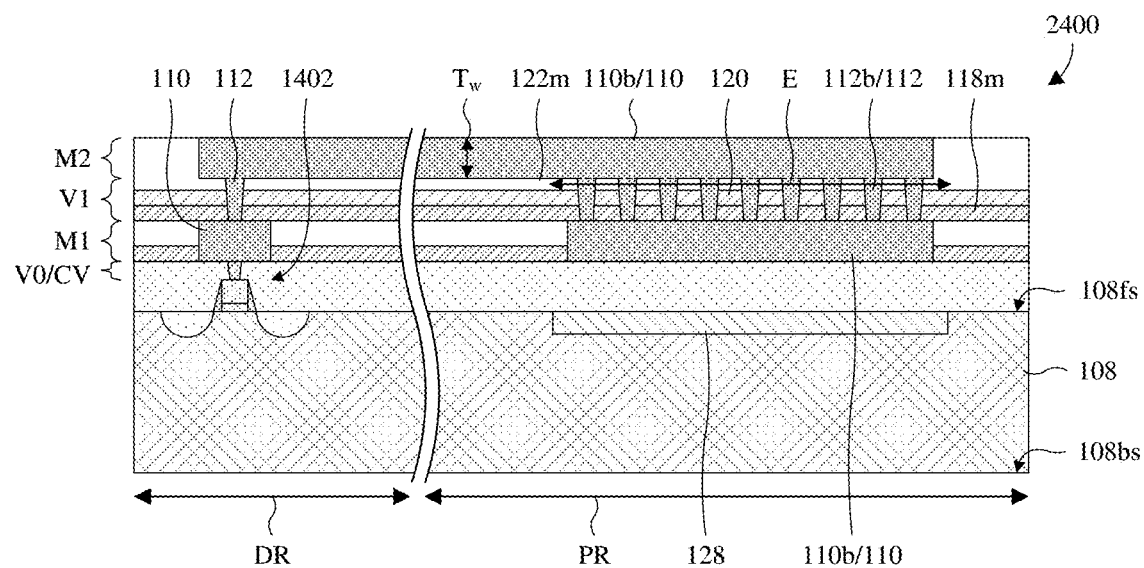

As illustrated by the cross-sectional view 2400 of FIG. 24, a plurality of additional wires 110 and a plurality of inter-wire vias 112 are formed. The inter-wire vias 112 respectively fill the via openings 2304 to form a first via level V1, whereas the additional wires 110 respectively fill the wire openings 2302 over the inter-wire vias 112 to form a second wire level M2. Further, the additional wires 110 include an additional bond wire 110b overlying the trench isolation structure 130 at the peripheral region PR, and the inter-wire vias 112 include a plurality of inter-wire bond vias 112b having a high density at the peripheral region PR. In some embodiments, a thickness $T_w$ of the additional wires 110 is small. A small thickness may, for example, be as above.

As with the via openings 2304, the high density may, for example, be a density greater than about 10% or some other suitable percentage. Further, density corresponds to a ratio of via area to wire area respectively for the inter-wire bond vias 112b at the first via level V1 and the bond wire 110b at the first wire level M1. The via area may, for example, correspond to top layout area of the inter-wire bond vias 112b, and the wire area may, for example, correspond to top layout area of the bond wire 110b. Alternatively, the via area may, for example, correspond to projection area of the inter-wire bond vias 112b when projected on to a plane extending parallel to a top or bottom surface of the semiconductor substrate 108, and the wire area may, for example, correspond to projection area of the bond wire 110b when projected onto the plane. In some embodiments, a top layout of inter-wire bond vias 112b is as in FIG. 2. In alternative embodiments, a cross-sectional layout of the inter-wire bond vias 112b is as in any of FIGS. 3, 5, 8, 10, and 13, and/or a top layout of the inter-wire bond vias 112b is as in any of FIGS. 4, 6, 7, 9A, 9B, 11A, 11B, and 12.

A process for forming the wires 110 may, for example, comprise: 1) depositing a metal layer covering the middle IMD layer 122m and filling the wire openings 2302; and 2) performing a planarization into the metal layer until a top surface of the metal layer is level with that of the middle IMD layer 122m. Other suitable processes are, however, amenable.

Figure 25:
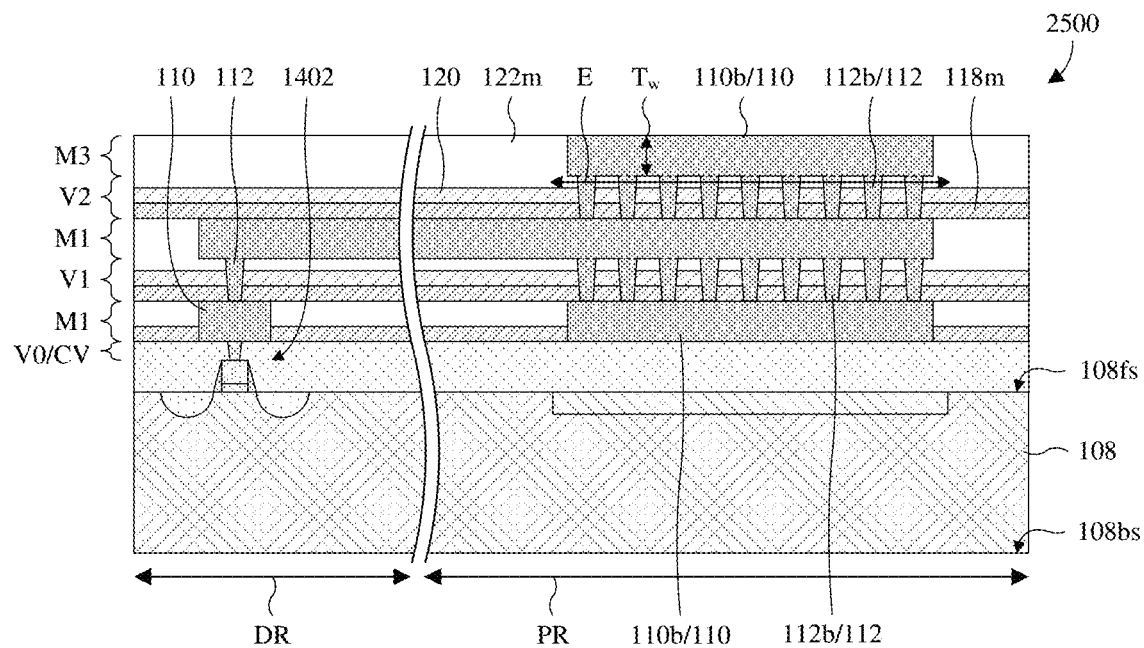

As illustrated by the cross-sectional view 2500 of FIG. 25, the acts described with regard to FIGS. 22-24 are repeated to form a second via level V2 and a third wire level M3. However, the bond wire 110b at the third wire level M3 has a different layout than the bond wire 110b at the second wire level M2. In some embodiments, the layout of the bond wire 110b at the third wire level M3 is the same as that of the bond wire 110b at the first wire level M1. In alternative embodiments, the acts described with regard to FIGS. 22-24 are repeated two or more times to form more wire and via levels.

Figure 26:
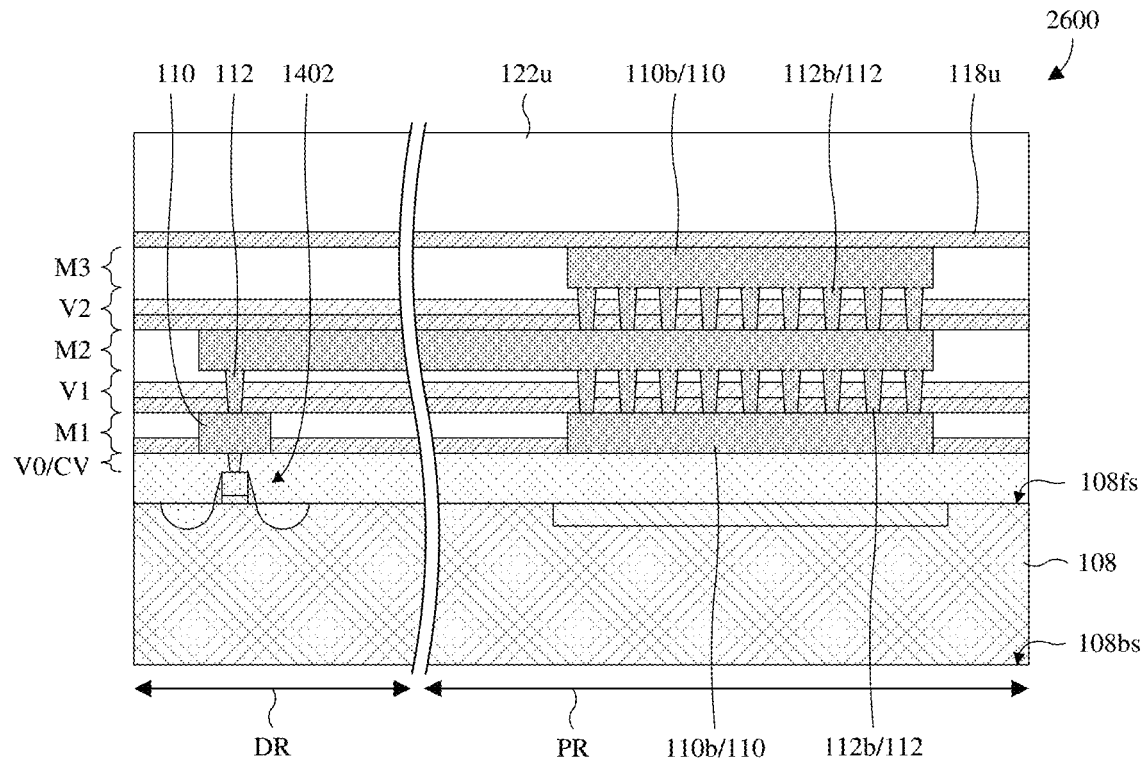

As illustrated by the cross-sectional view 2600 of FIG. 26, an upper ESL 118u and an upper IMD layer 122u are formed stacked over the wires 110 with the upper IMD layer 122u overlying the upper ESL 118u. The layers may, for example, be formed by CVD, PVD, ALD, some other suitable deposition process(es), or any combination of the foregoing.

Figure 27:
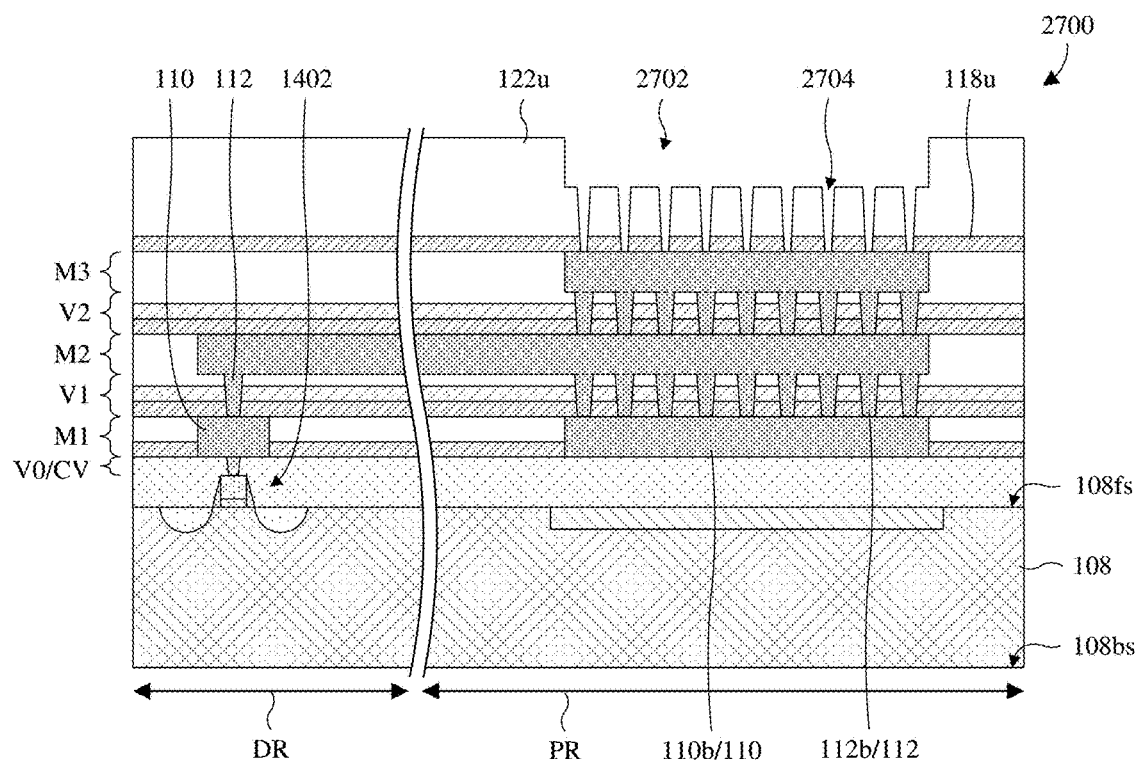

As illustrated by the cross-sectional view 2700 of FIG. 27, the upper ESL 118u and the upper IMD layer 122u are patterned to form a plurality of wire openings 2702 (only one of which is shown) and a plurality of via openings 2704. The via openings 2704 are between the wire openings 2702 and the wires 110 at the third wire level M3. Further, the via openings 2704 extend respectively from the wire openings 2702 respectively to the wires 110 at the third wire level M3. A process for performing the patterning may, for example, be as described with regard to FIG. 23. Other suitable processes are, however, amenable.

Figure 28:
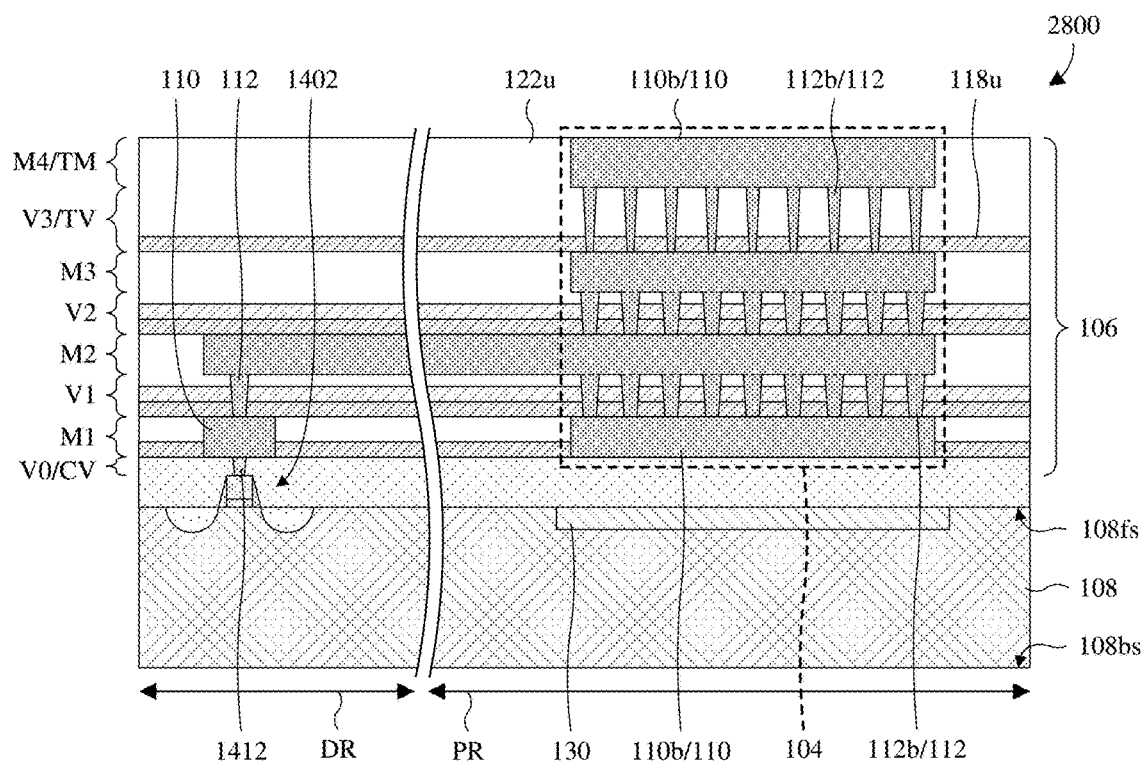

As illustrated by the cross-sectional view 2800 of FIG. 28, a plurality of additional wires 110 and a plurality of inter-wire vias 112 are formed. The inter-wire vias 112 respectively fill the via openings 2704 to form a third via level V3, which may also be referred to as a top via level TV. The additional wires 110 respectively fill the wire openings 2702 over the inter-wire vias 112 to form a fourth wire level M4, which may also be referred to as a top wire level TM. Further, the additional wires 110 include an additional bond wire 110b overlying the trench isolation structure 130 at the peripheral region PR, and the inter-wire vias 112 include a plurality of inter-wire bond vias 112b at the peripheral region PR. In some embodiments, the inter-wire bond vias 112b at the top via level TV have a high density. In other embodiments, the inter-wire bond vias 112b at the top via level TV have a low density. As above, the high density may, for example, be a density greater than about 10% or some other suitable percentage. A low density may, for example, be a density less than about 1%, the high density, or some other suitable value.

A process for forming the wires 110 may, for example, comprise: 1) depositing a metal layer covering the upper IMD layer 122u and filling the wire openings 2702; and 2) performing a planarization into the metal layer until a top surface of the metal layer is level with that of the upper IMD layer 122u. Other suitable processes are, however, amenable.

The contact vias 1412 (only one of which is shown), as well as the wires 110 and the inter-wire vias 112, collectively form an interconnect structure 106. The interconnect structure 106 provides electrical coupling between semiconductor devices (e.g., the semiconductor device 1402) on the semiconductor substrate 108. Further, the inter-wire bond vias 112b and the inter-wire bond vias 112b at the peripheral region PR form a columnar structure 104 overlying the trench isolation structure 130. The columnar structure 104 provides support and electrical coupling for a bond pad structure hereafter formed. Because of the high via density at the first and second via levels V1, V2, the strength of the columnar structure 104 is high even if the thickness $T_w$ of first, second, and third wire levels M1-M3 is small. The high strength reduces the likelihood of peeling and hence failure at the columnar structure 104 when shear force is applied to the columnar structure 104 through the bond pad structure hereafter formed.

Figure 29:
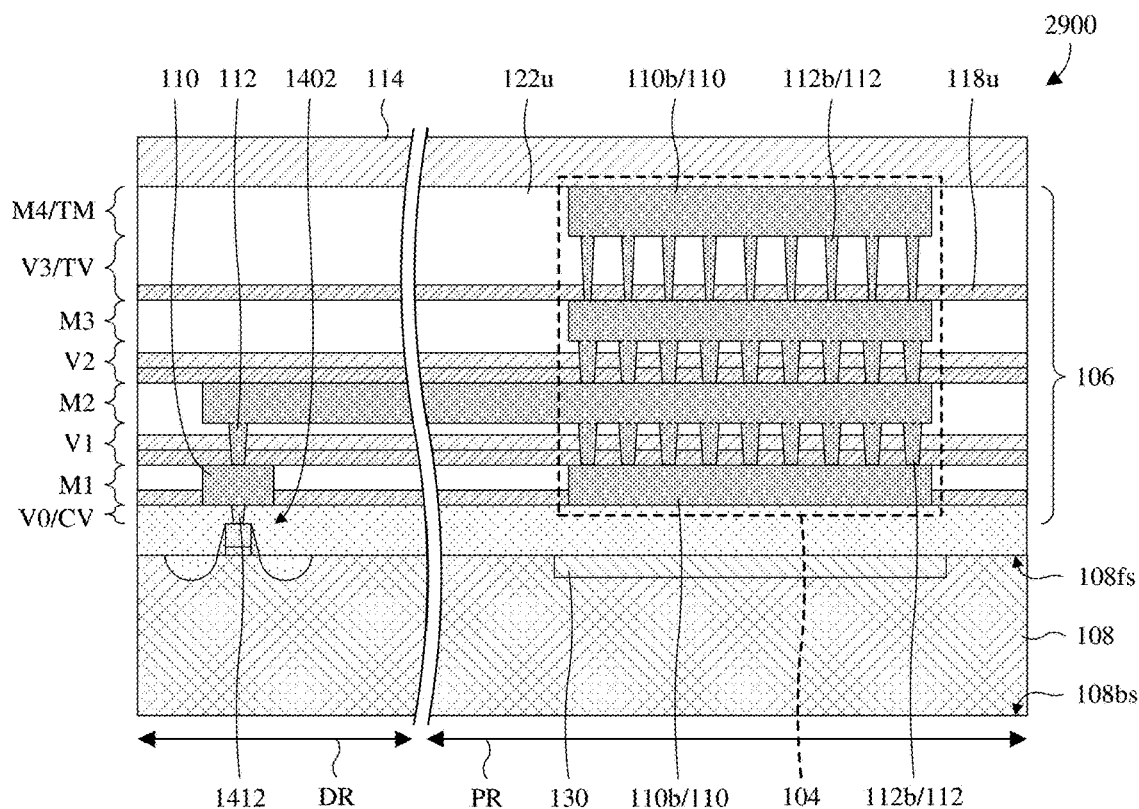

As illustrated by the cross-sectional view 2900 of FIG. 29, a passivation layer 114 is formed over the upper IMD layer 122u and the top wire level TM. The passivation layer 114 may, for example, be formed by CVD, PVD, ALD, some other suitable deposition process(es), or any combination of the foregoing.

Figure 30:
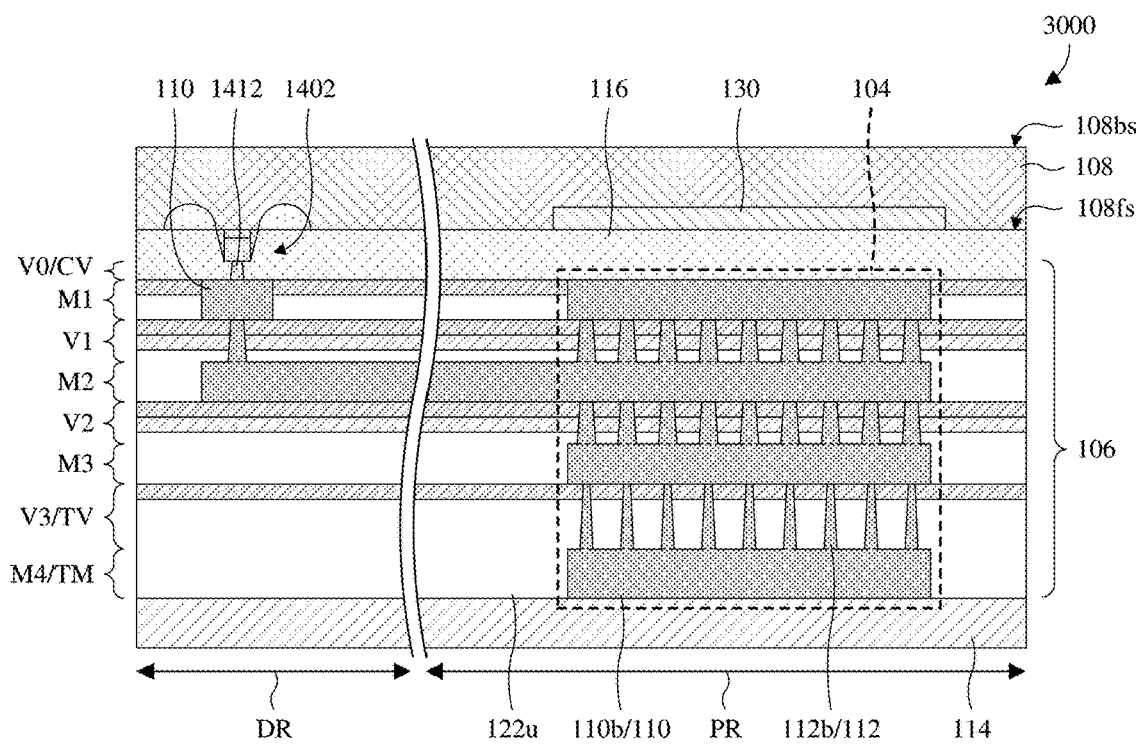

As illustrated by the cross-sectional view 3000 of FIG. 30, the structure of FIG. 29 is vertically flipped. Further, the semiconductor substrate 108 is thinned from the backside 108bs of the semiconductor substrate 108. The thinning may, for example, be performed by a chemical mechanical polish (CMP) or some other suitable planarization process.

Figure 31:
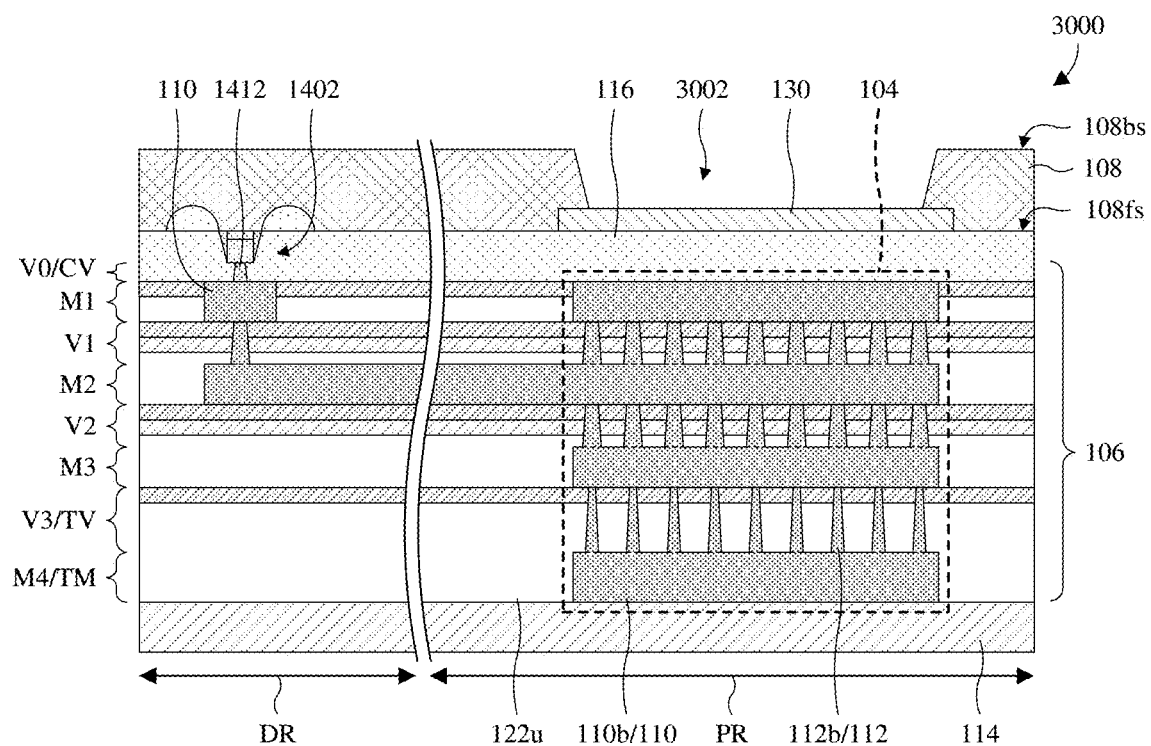

As illustrated by the cross-sectional view 3100 of FIG. 31, the backside 108bs of the semiconductor substrate 108 is patterned to form a first pad opening 3102 overlying and exposing the trench isolation structure 130. The patterning may, for example, be performed by a photolithography/etching process or some other suitable process.

Figure 32:
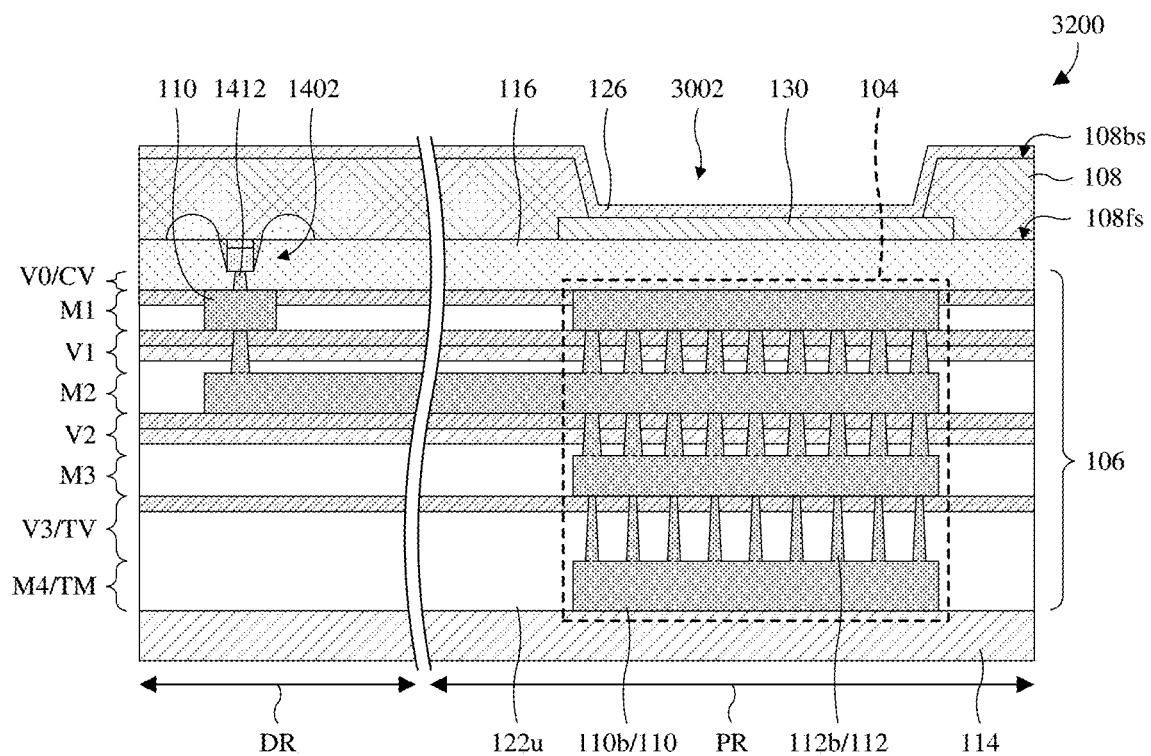

As illustrated by the cross-sectional view 3200 of FIG. 32, a backside dielectric liner 126 is formed covering the backside 108bs of the semiconductor substrate 108 and lining the first pad opening 3102. The backside dielectric liner 126 may, for example, be formed by CVD, PVD, ALD, some other suitable deposition process(es), or any combination of the foregoing.

Figure 33:
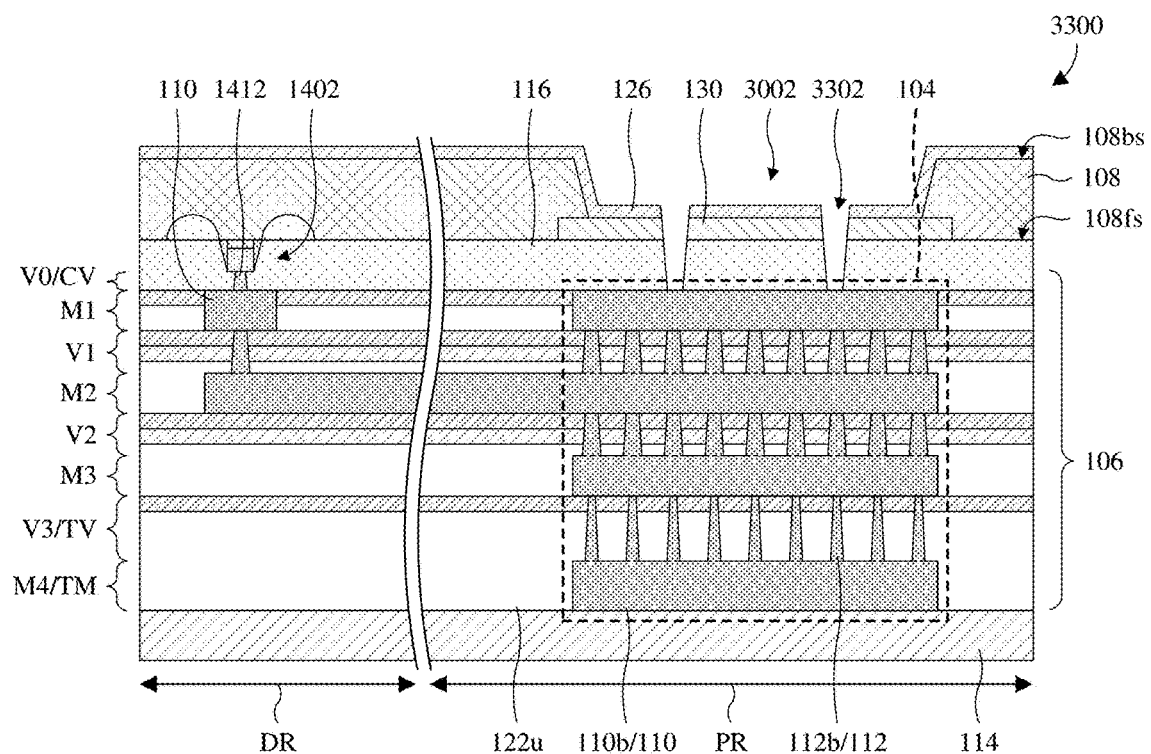

As illustrated by the cross-sectional view 3300 of FIG. 33, the backside dielectric liner 126, the trench isolation structure 130, and the ILD layer 116 are patterned to form a pair of second pad openings 3302 extending from a bottom of the first pad opening 3002 to the bond wire 110b at the first wire level M1. The patterning may, for example, be performed by a photolithography/etching process or some other suitable process.

Figure 34:
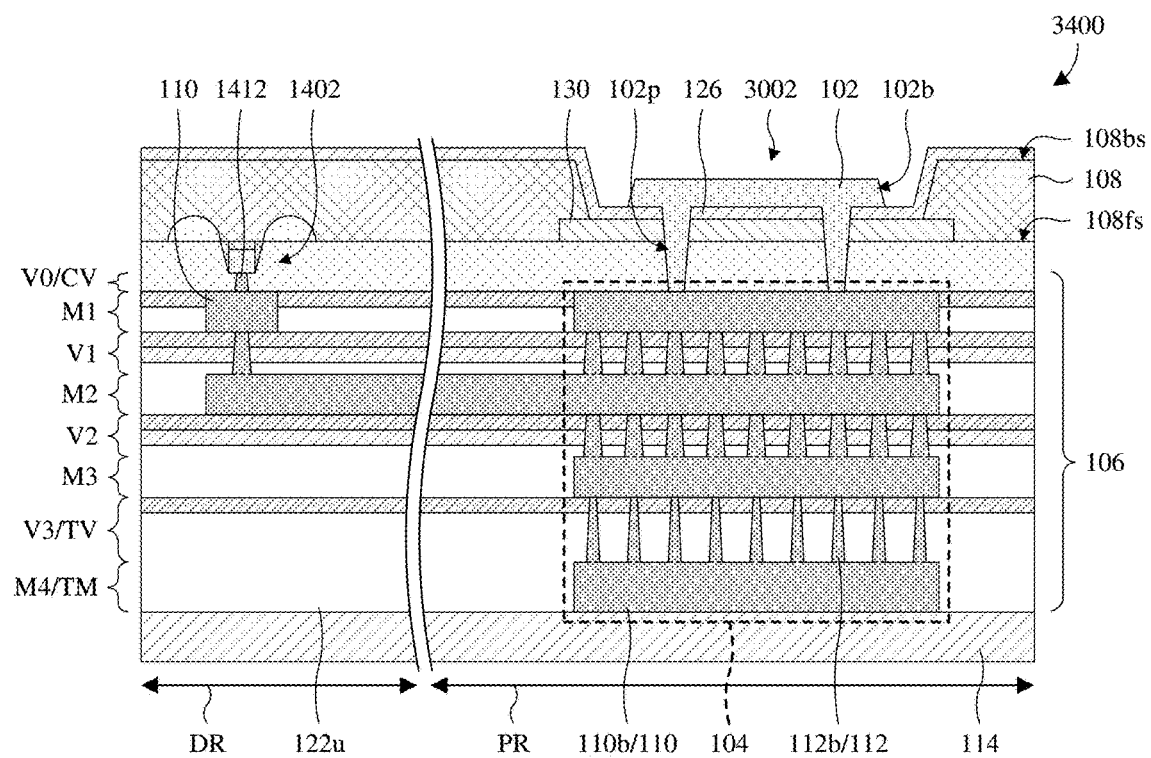

As illustrated by the cross-sectional view 3400 of FIG. 34, a bond pad structure 102 is formed in the first and second pad openings 3002, 3302. The bond pad structure 102 comprises a pad body 102b and a pair of pad protrusions 102p. The pad body 102b is in the first pad opening 3002, and the pad protrusions 102p are respectively in the second pad openings 3302. The pad protrusions 102p are respectively on opposite sides of the pad body 102b and extend from the bottom of the pad body 102b to the bond wire 110b in the first wire level M1, thereby electrically coupling the bond pad structure 102 to the columnar structure 104.

A process for forming the bond pad structure 102 may, for example, comprise: 1) depositing a conductive layer lining the first pad opening 3002 and filling the second pad openings 3302; and 2) patterning the conductive layer into the bond pad structure 102. Other suitable processes are, however, amenable. The patterning may, for example, be performed by a photolithography/etching process or some other suitable patterning process.

Because the columnar structure 104 has a high via density at the first and second via levels V1, V2, the columnar structure 104 is strong. This reduces the likelihood of peeling at the first via level V1 and other via levels in response to shear force on the bond pad structure 102. Hence, the high via density may reduce device failure and increase yields.

Figure 35:
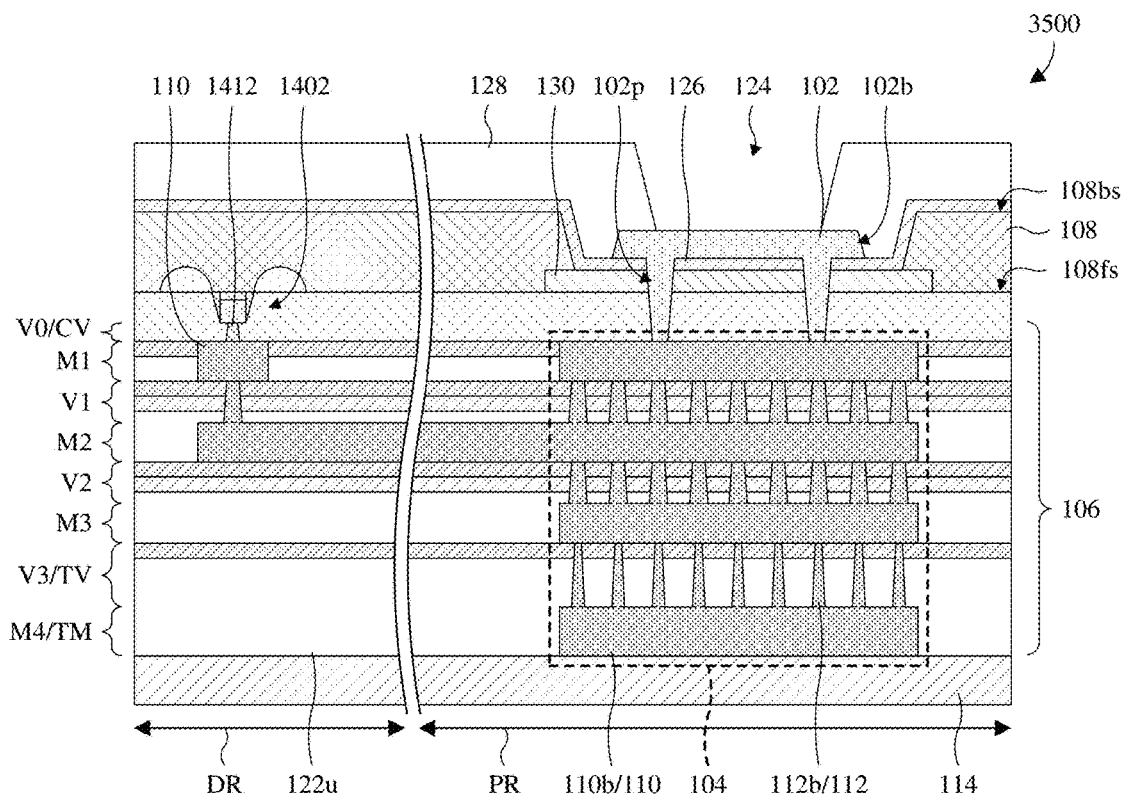

As illustrated by the cross-sectional view 3500 of FIG. 35, a backside dielectric layer 128 is formed covering the bond pad structure 102 and the backside dielectric liner 126 and further filling the first pad opening 3002. A process for forming the backside dielectric layer 128 may, for example, comprise: 1) depositing the backside dielectric layer 128; and 2) planarizing the backside dielectric layer 128 to flatten a top of the backside dielectric layer 128. Other suitable processes are, however, amenable. The depositing may, for example, be performed by CVD, PVD, ALD, some other suitable deposition process(es), or any combination of the foregoing. The planarization may, for example, be performed by a CMP or some other suitable planarization.

Also illustrated by the cross-sectional view 3500 of FIG. 35, the backside dielectric layer 128 is patterned to form a third pad opening 124 overlying and exposing the bond pad structure 102. The patterning may, for example, be performed by a photolithography/etching process or some other suitable process.

While FIGS. 17-35 are described with reference to a method, it will be appreciated that the structures shown in FIGS. 17-35 are not limited to the method but rather may stand alone separate of the method. While FIGS. 17-35 are described as a series of acts, it will be appreciated that the order of the acts may be altered in other embodiments. While FIGS. 17-35 illustrate and describe as a specific set of acts, some acts that are illustrated and/or described may be omitted in other embodiments. Further, acts that are not illustrated and/or described may be included in other embodiments.

Figure 36:
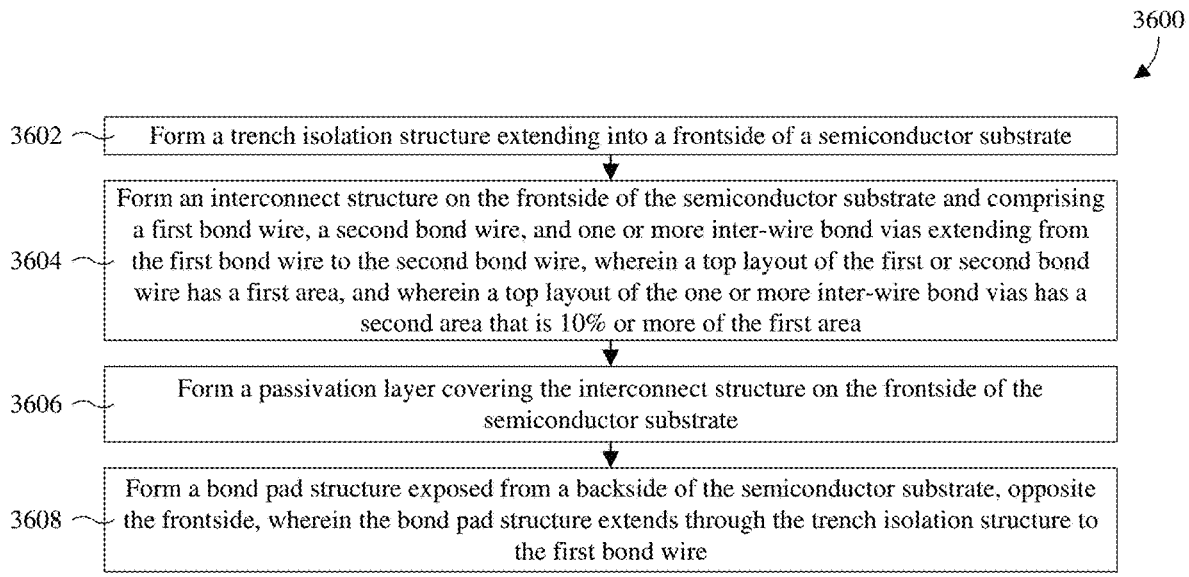
FIG. 36 provides a block diagram of some embodiments of the method of FIGS. 17-35.

With reference to FIG. 36, a block diagram 3600 of some embodiments of the method of FIGS. 17-35 is provided.

At 3602, a trench isolation structure is formed extending into a frontside of a semiconductor substrate. See, for example, FIG. 17.

At 3604, an interconnect structure is formed on the frontside of the semiconductor substrate and comprises a first bond wire, a second bond wire, and one or more inter-wire bond vias extending from the first bond wire to the second bond wire, wherein a top layout of the first or second bond wire has a first area, and wherein a top layout of the one or more inter-wire bond vias has a second area that is 10% or more of the first area. See, for example, FIGS. 18-28.

At 3606, a passivation layer is formed covering the interconnect structure on the frontside of the semiconductor substrate. See, for example, FIG. 29.

At 3608, a bond pad structure is formed exposed from a backside of the semiconductor substrate, opposite the frontside, wherein the bond pad structure extends through the trench isolation structure to the first bond wire. See, for example, FIGS. 30-35.

While the block diagram 3600 of FIG. 36 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 37-42, a series of cross-sectional views 3700-4200 of some alternative embodiments of a method for forming an IC chip is provided in which a bond pad structure extends to a columnar structure with a high via density. As seen hereafter, the method illustrates formation of the IC chip of FIG. 16D but may alternatively be employed to form some other suitable IC chip.

Figure 37:
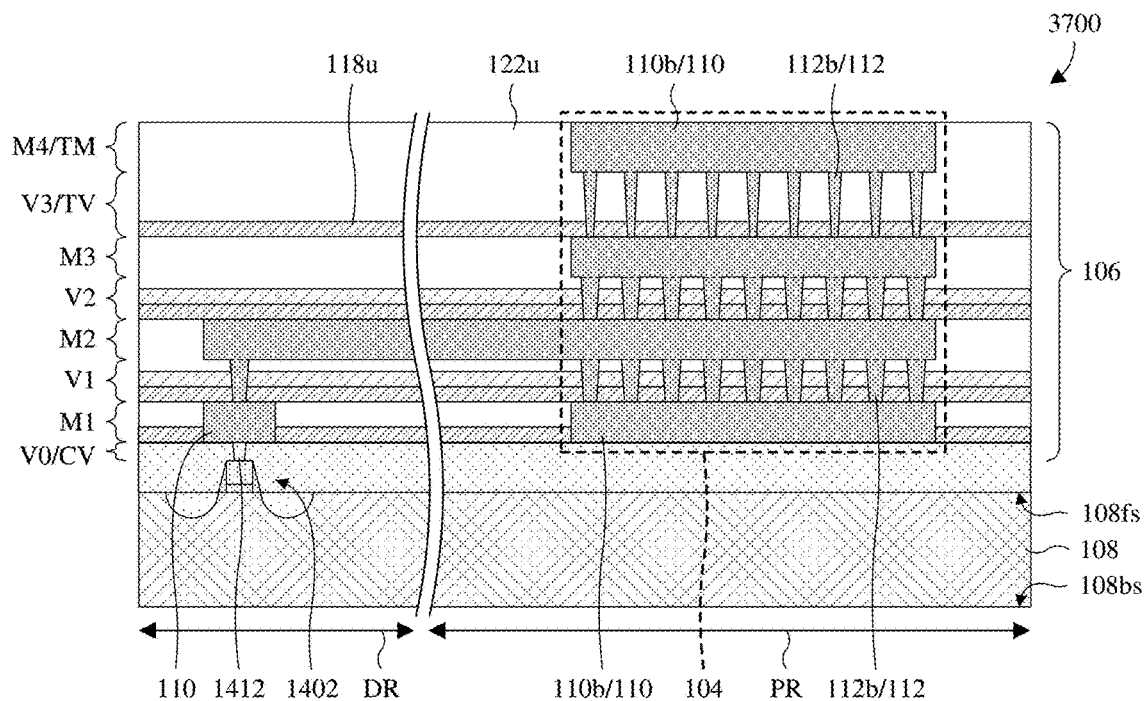
FIGS. 37-42 provide a series of cross-sectional views of some alternative embodiments of a method for forming an IC chip in which a bond pad structure extends to a columnar structure with a high via density.

As illustrated by the cross-sectional view 3700 of FIG. 37, the acts described with regard to FIGS. 17-28 are performed as described above, except that the trench isolation structure 130 is omitted. In alternative embodiments, the trench isolation structure 130 is formed.

Figure 38:
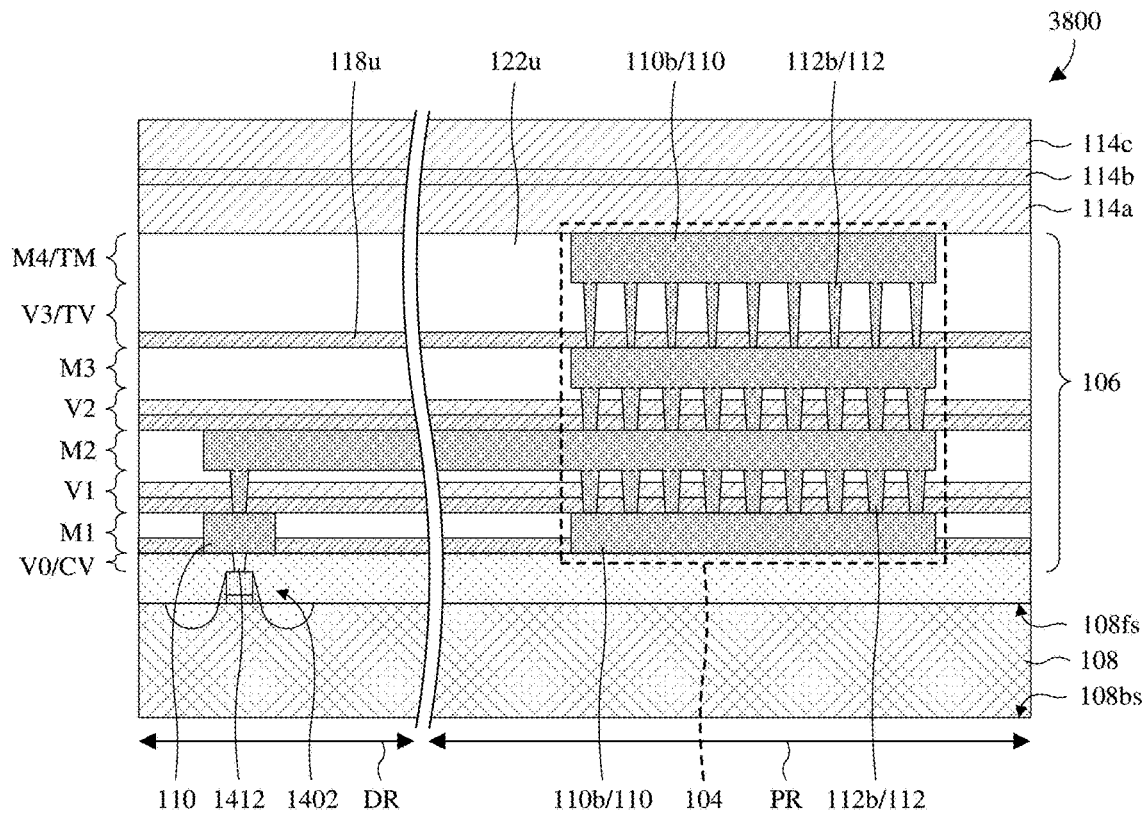

As illustrated by the cross-sectional view 3800 of FIG. 38, a plurality of passivation layers 114a-114c are formed stacked over the interconnect structure 106 on the frontside 108fs of the semiconductor substrate 108. The plurality of passivation layers 114a-114c comprise a first passivation layer 114a, a second passivation layer 114b overlying the first passivation layer 114a, and a third passivation layer 114c overlying the second passivation layer 114b. Further, the second passivation layer 114b is a different material type than the first and third passivation layers 114a, 114c. The forming may, for example, be performed by CVD, PVD, ALD, some other suitable deposition process(es), or any combination of the foregoing.

Figure 39:
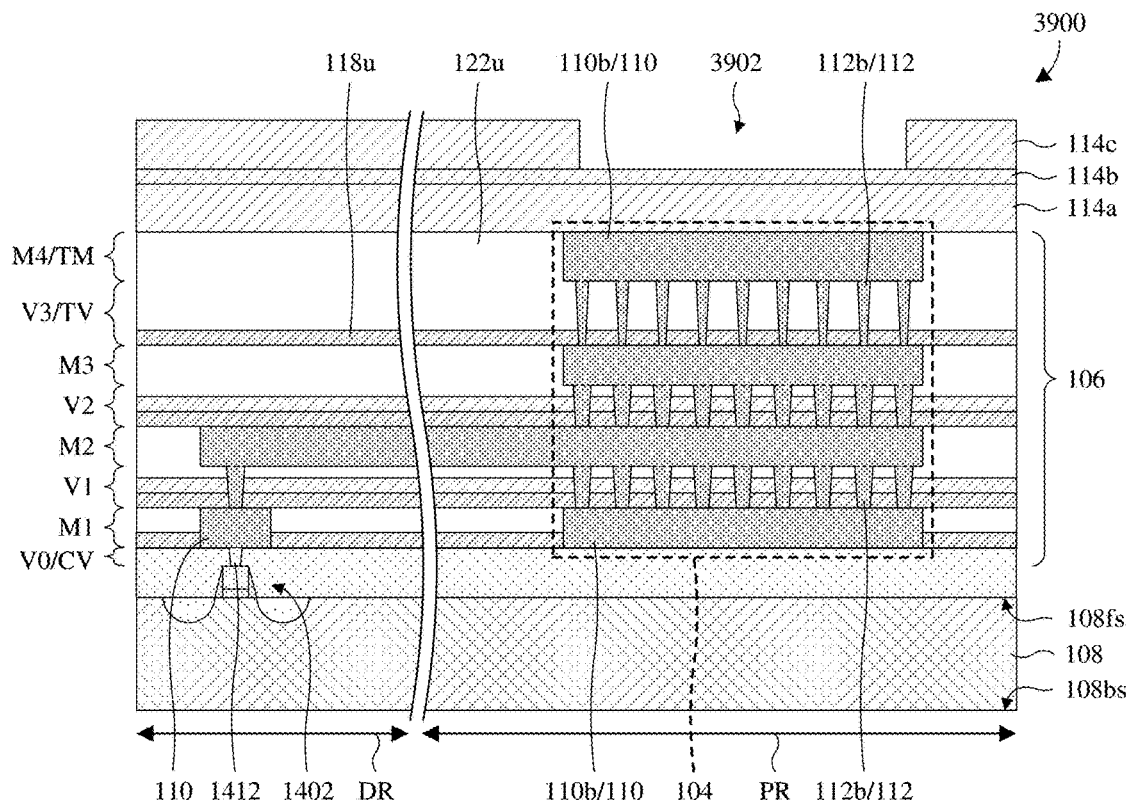

As illustrated by the cross-sectional view 3900 of FIG. 39, the third passivation layer 114c is patterned to form a first pad opening 3902 overlying the columnar structure 104 and exposing the second passivation layer 114b. The patterning may, for example, be performed by a photolithography/etching process or some other suitable process. Further, etching of the photolithography/etching process may, for example, stop on the second passivation layer 114b, such that the second passivation layer 114b may serve as an etch stop.

Figure 40:
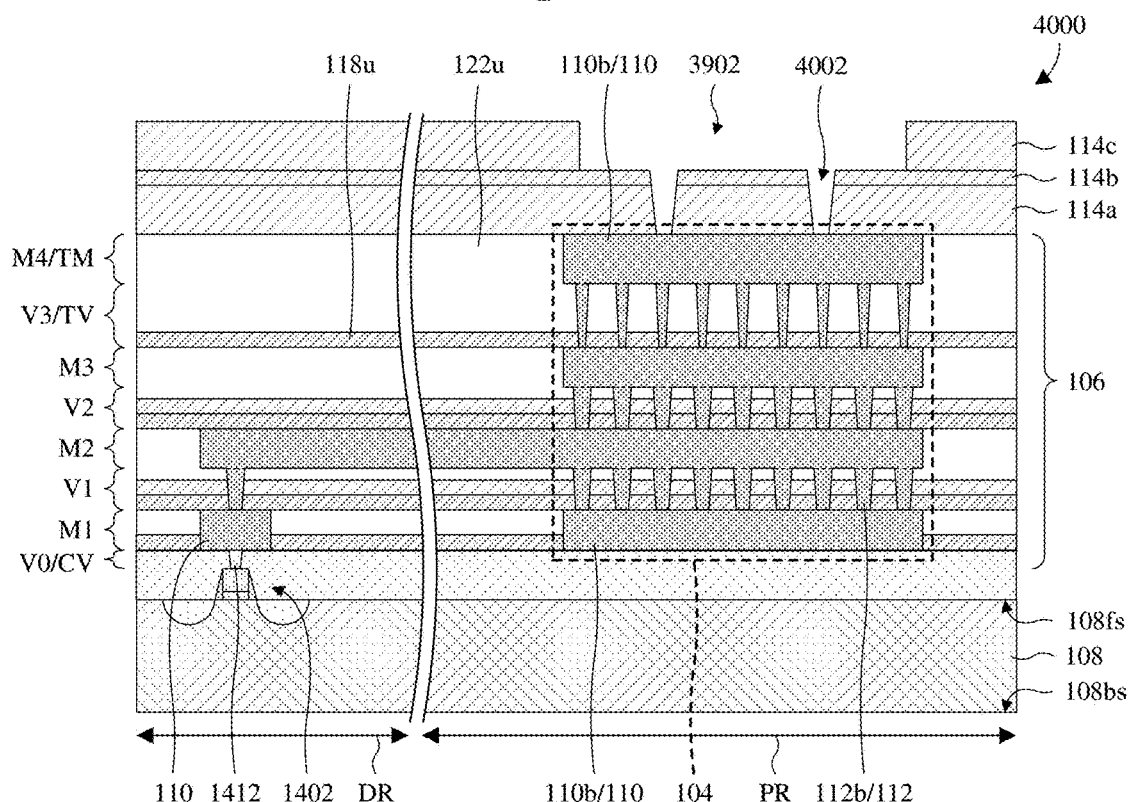

As illustrated by the cross-sectional view 4000 of FIG. 40, the first and second passivation layers 114a, 114b are patterned to form a pair of second pad openings 4002 extending from a bottom of the first pad opening 3902 to the bond wire 110b at the top wire level TM. The patterning may, for example, be performed by a photolithography/etching process or some other suitable process.

Figure 41:
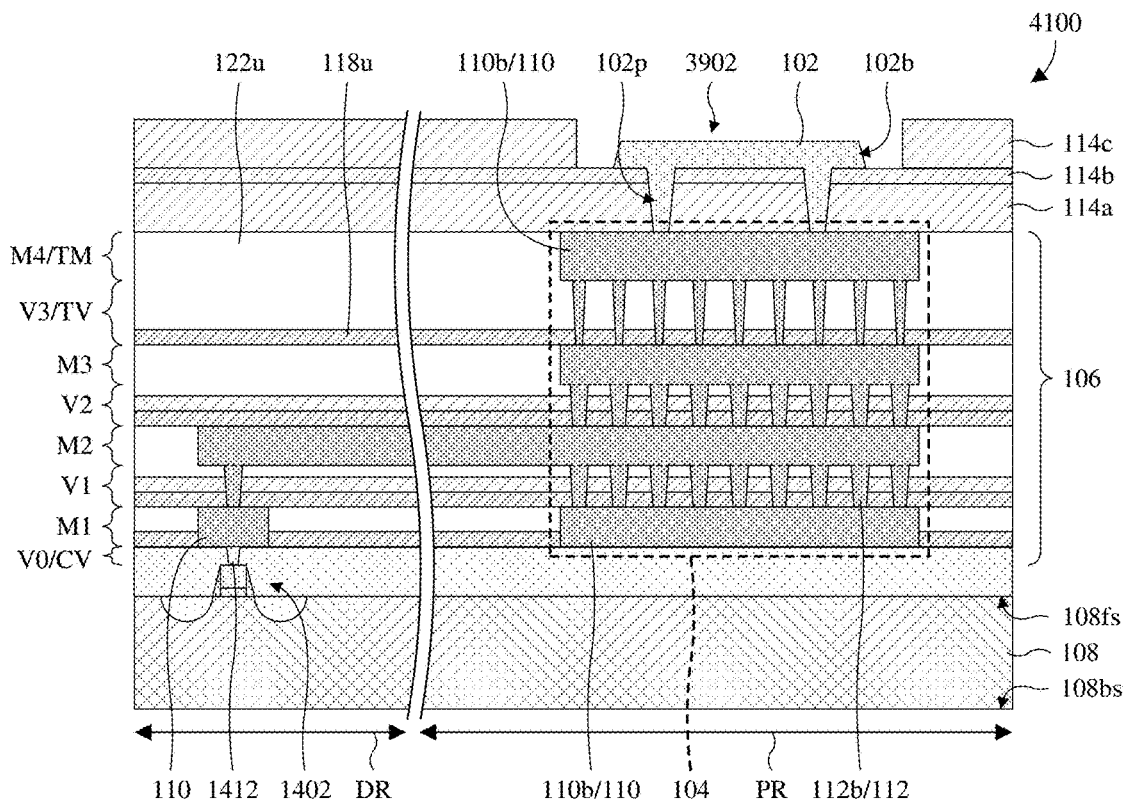

As illustrated by the cross-sectional view 4100 of FIG. 41, a bond pad structure 102 comprising a pad body 102b and a pair of pad protrusions 102p is formed in the first and second pad openings 3902, 4002. The pad protrusions 102p are respectively on opposite sides of the pad body 102b and extend from the bottom of the pad body 102b to the bond wire 110b in the top wire level TM, thereby electrically coupling the bond pad structure 102 to the columnar structure 104. The bond pad structure 102 may, for example, be formed as described with regard to FIG. 34.

Because the columnar structure 104 has a high via density at the first and second via levels V1, V2 and, in some embodiments, the top via level TV, the columnar structure 104 is strong. This reduces the likelihood of peeling in response to shear force being applied to the bond pad structure 102. Hence, the high via density may reduce device failure and increase yields.

Figure 42:
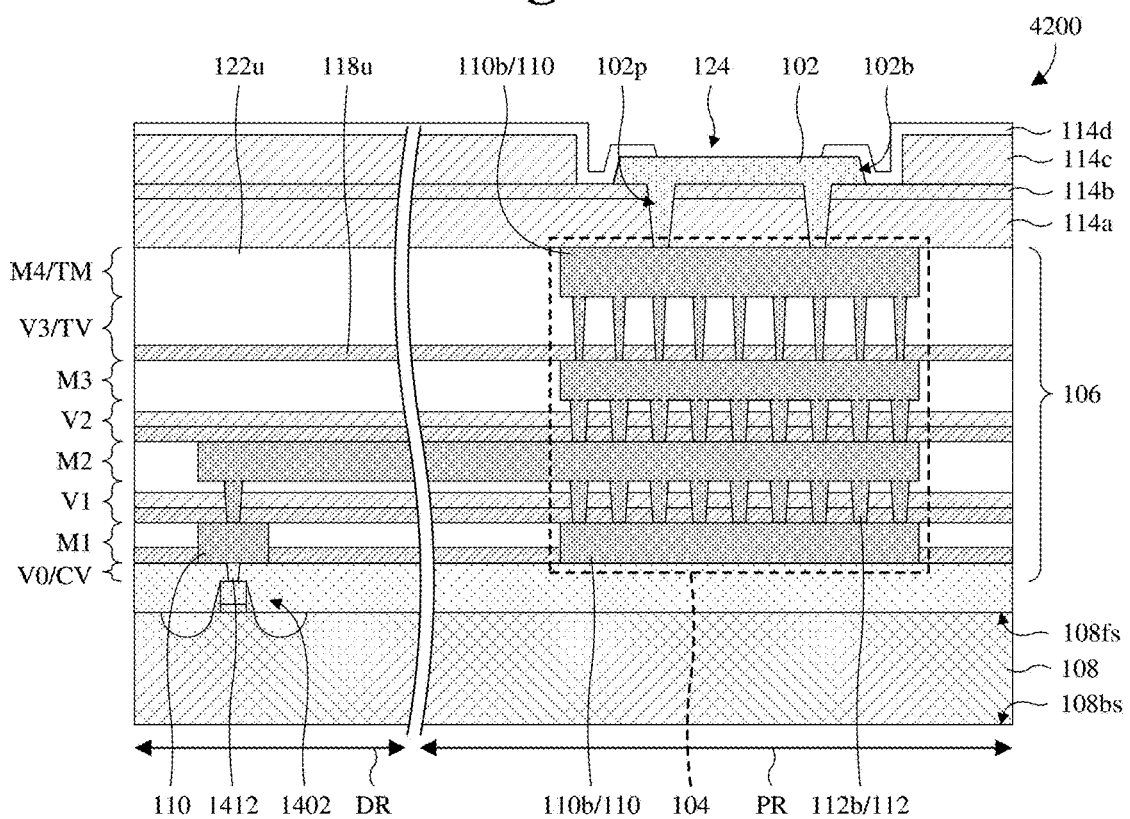

As illustrated by the cross-sectional view 4200 of FIG. 42, a fourth passivation layer 114d is formed covering the third passivation layer 114c and the bond pad structure 102 and further lining the first pad opening 3902. The forming may, for example, be performed by CVD, PVD, ALD, some other suitable deposition process, or any combination of the foregoing.

Also illustrated by the cross-sectional view 4200 of FIG. 42, the fourth passivation layer 114d is patterned to form a third pad opening 124 exposing the bond pad structure 102.

The patterning may, for example, be performed by a photolithography/etching process or some other suitable process.

While FIGS. 37-42 are described with reference to a method, it will be appreciated that the structures shown in FIGS. 37-42 are not limited to the method but rather may stand alone separate of the method. While FIGS. 37-42 are described as a series of acts, it will be appreciated that the order of the acts may be altered in other embodiments. While FIGS. 37-42 illustrate and describe as a specific set of acts, some acts that are illustrated and/or described may be omitted in other embodiments. Further, acts that are not illustrated and/or described may be included in other embodiments.

Figure 43:
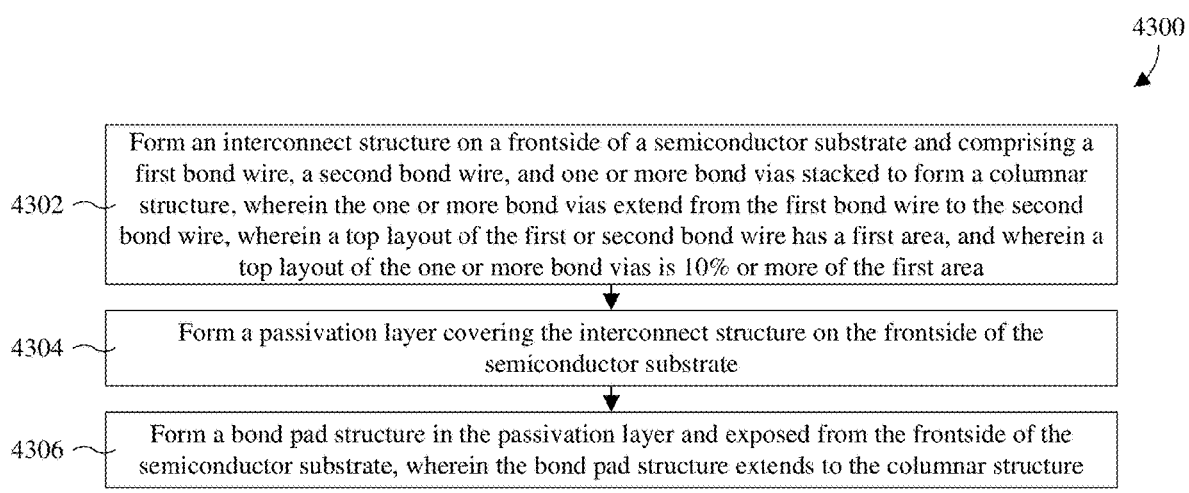
FIG. 43 provides a block diagram of some embodiments of the method of FIGS. 37-42.

With reference to FIG. 43, a block diagram 4300 of some embodiments of the method of FIGS. 37-42 is provided.

At 4202, an interconnect structure is formed on a frontside of a semiconductor substrate and comprises a first bond wire, a second bond wire, and one or more bond vias stacked to form a columnar structure, wherein the one or more bond vias extend from the first bond wire to the second bond wire, wherein a top layout of the first or second bond wire has a first area, and wherein a top layout of the one or more bond vias has a second area that is 10% or more of the first area. See, for example, FIG. 37.

At 4204, a passivation layer is formed covering the interconnect structure on the frontside of the semiconductor substrate. See, for example, FIG. 38.

At 4206, a bond pad structure is formed in the passivation layer and exposed from the frontside of the semiconductor substrate, wherein the bond pad structure extends to the columnar structure. See, for example, FIGS. 39-42.

While the block diagram 4300 of FIG. 43 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an IC chip including: a semiconductor substrate; an interconnect structure on a frontside of the semiconductor substrate, wherein the interconnect structure includes a first bond wire, a second bond wire, and one or more bond vias forming a columnar structure in which the one or more bond vias separate the first and second bond wires and extend from the first bond wire to the second bond wire; and a pad structure inset into a backside of the semiconductor substrate, opposite the frontside, and extending through the semiconductor substrate to the first bond wire; wherein a first projection of the first or second bond wire onto a plane parallel to a top surface of the semiconductor substrate has a first area, and wherein a second projection of the one or more bond vias onto the plane has a second area that is 10% or more of the first area. In some embodiments, the second area is 40% or more of the first area. In some embodiments, a thickness of the first bond wire is less than about 1000 angstroms. In some embodiments, the second projection completely overlaps with the first projection. In some embodiments, the first projection corresponds to the first bond wire, wherein a third projection of the second bond wire onto the plane has a third area, and wherein the second area is 10% or more of the third area. In some embodiments, the first and third projections are the same. In some embodiments, the first and third projections are different. In some embodiments, the interconnect structure includes a plurality of wires and a plurality of vias respectively grouped into a plurality of wire levels and a plurality of via levels, wherein the wire and via levels are alternatingly stacked, wherein the plurality of wires includes the first and second bond wires in different wire levels, and wherein the plurality of vias includes the one or more bond vias in a single via level. In some embodiments, the first bond wire is in a wire level of the plurality of wire levels closest to the semiconductor substrate. In some embodiments, the IC chip further includes: a pixel array on the semiconductor substrate; and a semiconductor device on the frontside of the semiconductor device at the pixel array and electrically coupled to the columnar structure.

In other embodiments, the present disclosure provides an IC chip including: a substrate including a device region and a peripheral region surrounding the device region; a semiconductor device at the device region; an interconnect structure on the substrate and electrically coupled with the semiconductor device, wherein the interconnect structure includes a first wire, a second wire, and one or more vias forming a columnar structure at the peripheral region, and wherein the one or more vias extend from the second wire to direct contact with a surface of the first wire at an interface; and a bond pad structure vertically stacked with and extending to the columnar structure; wherein the surface of the first wire has a first area, and wherein the interface has a second area that is about 10% or more of the first area. In some embodiments, the interconnect structure is on an under side of the substrate, wherein the bond pad structure is exposed from an upper side of the substrate, wherein the bond pad structure extends through the substrate to the first wire. In some embodiments, the one or more vias have only a single via separating the first and second wires, wherein a top layout of the single via is a rectangle with an interior that is solid from edge to edge. In some embodiments, the one or more vias have only a single via separating the first and second wires, and wherein a top layout of the single via is grid shaped. In some embodiments, the one or more vias includes a plurality of vias in a plurality of rows and a plurality of columns. In some embodiments, the one or more vias includes a plurality of line-shaped vias elongated in parallel. In some embodiments, the IC chip is a 3D IC chip, wherein the substrate, the semiconductor device, and the interconnect structure form a first IC chip, and wherein the IC chip further includes a second IC chip underlying and electrically coupled to the first and second wires.

In some embodiments, the present disclosure provides a method for forming an IC chip, the method including: forming a trench isolation structure extending into a frontside of a substrate; forming an interconnect structure overlying the trench isolation structure on the frontside, and including a first bond wire, a second bond wire overlying the first bond wire, and one or more bond vias extending from the first bond wire to the second bond wire; and forming a pad structure from a backside of the substrate, opposite the frontside, wherein the pad structure extends through the trench isolation structure to the first bond wire; wherein a top layout of the first or second bond wire has a first area, and wherein a top layout of the one or more bond vias has a second area that is 10% or more of the first area. In some embodiments, the interconnect structure includes a level of contact vias extending from semiconductor devices on the frontside of the substrate, wherein the method further includes depositing a passivation layer covering the interconnect structure on the frontside of the substrate, and wherein the first and second bond wires and the one or more bond vias partially form a structure having a columnar profile that extends continuously from the level of contact vias to the passivation layer. In some embodiments, the method further includes: forming a semiconductor device and a contact via on the frontside of the substrate, wherein the contact via extends from the semiconductor device away from the substrate; depositing an IMD layer covering the semiconductor device and the contact via on the frontside; patterning the IMD layer to form a first wire opening and a second wire opening respectively overlying the trench isolation structure and the semiconductor device at a common elevation, wherein the second wire opening exposes the contact via; depositing a metal layer filling the first and second wire openings; and performing a planarization into the metal layer until a top surface of the metal layer is level with that of the IMD layer to form the first bond wire in the first wire opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit (IC) chip, the method comprising:
    forming a trench isolation structure extending into a frontside of a substrate;
    forming a semiconductor device on the frontside;
    forming an interconnect structure overlying the trench isolation structure and the semiconductor device on the frontside, and comprising a device wire, a contact via extending from the device wire to the semiconductor device, a first bond wire farther from the substrate than the device wire, a second bond wire overlying the first bond wire and farther from the substrate than the first bond wire, and a plurality of bond vias extending vertically in a dimension orthogonal to a surface of the first bond wire, from contact with the first bond wire to contact with the second bond wire; and
    forming a pad structure from a backside of the substrate, opposite the frontside, wherein the pad structure has a pair of protrusions extending through the trench isolation structure to contact with the surface of the first bond wire;
    wherein a top layout of the first or second bond wire has a first area, wherein a top layout of the plurality of bond vias has a second area that is 10% or more of the first area, wherein the plurality of bond vias are spaced from each other and comprise a central bond via and a pair of peripheral bond vias, wherein the central bond via is in a plane that is orthogonal to the dimension and that is between and spaced from the first and second bond wires, and wherein the pair of peripheral bond vias extend in individual, continuous closed paths around the central bond via in the plane.

2. The method according to claim 1, further comprising:
depositing an intermetal dielectric (IMD) layer covering the semiconductor device and the contact via on the frontside;
patterning the IMD layer to form a wire opening overlying the semiconductor device, wherein the wire opening exposes the contact via;
depositing a metal layer filling the wire opening; and
performing a planarization into the metal layer until a top surface of the metal layer is level with that of the IMD layer to form the device wire in the wire opening.

3. The method according to claim 1, wherein the first and second bond wires and the plurality of bond vias partially form a columnar structure, wherein a first end of the first bond wire directly overlies the semiconductor device at a location laterally offset from the columnar structure, and wherein a second end of the first bond wire, opposite the first end, is at the columnar structure.

4. The method according to claim 1, wherein the top layout of the first or second bond wire is a top layout of the second bond wire.

5. The method according to claim 1, further comprising:
depositing an intermetal dielectric (IMD) layer covering the first bond wire on the frontside;
patterning the IMD layer to form a plurality of via openings and a wire opening overlapping with the plurality of via openings;
depositing a metal layer filling the plurality of via openings and the wire opening; and
performing a planarization into the metal layer to level a top surface of the metal layer with a top surface of the IMD layer.

6. The method according to claim 1, wherein the central bond via has an outer sidewall that is square ring shaped in the plane, and wherein each of the pair of peripheral bond vias has an inner sidewall that is square ring shaped in the plane and further has an outer sidewall that is square ring shaped in the plane.

7. The method according to claim 6, wherein a total of only three vias are directly between the first bond wire and the second bond wire in the dimension, and wherein the plane is parallel with the surface of the first bond wire.

8. A method for forming an integrated circuit (IC) chip, the method comprising:
forming a first bond wire overlying a substrate on a frontside of the substrate;
depositing a dielectric structure overlying the first bond wire;
patterning the dielectric structure to form a via opening and a wire opening overlapping with the via opening, wherein the via opening and the wire opening expose a surface of the first bond wire;
filling the via opening and the wire opening with conductive material to respectively form a via structure and a second bond wire; and
forming a pad exposed from a backside of the substrate, opposite the frontside, and comprising a pair of protrusions protruding through the substrate to the first bond wire;
wherein the surface of the first bond wire has a first area, wherein a portion of the surface of the first bond wire exposed by the via opening has a second area that is more than 10% of the first area, wherein the via structure has a pad region and a ring-shaped region in a plane parallel to the surface of the first bond wire and between and spaced from the first bond wire and the second bond wire, wherein the ring-shaped region is non-overlapping with the pad region and has a ring-shaped sidewall extending in a continuous, closed path around the pad region in the plane, wherein the via structure further has a first pair of sidewalls and a second pair of sidewalls that are non-overlapping with the pad and ring-shaped regions and that extend continuously, and in parallel with each other, from the pad region to the ring-shaped region in the plane, wherein the first pair of sidewalls share a first length in the plane and are separated from each other by a first separation, and wherein the second pair of sidewalls share a second length in the plane greater than the first length and are separated from each other by a second separation greater than the first separation.

9. The method according to claim 8, wherein the dielectric structure comprises an etch stop layer, a buffer layer overlying the etch stop layer, and an intermetal dielectric (IMD) layer overlying the buffer layer, and wherein a bottom of the wire opening is elevated relative to a top surface of the buffer layer.

10. The method according to claim 8, further comprising:
forming a transistor on the frontside of the substrate;
forming a contact via extending from the transistor; and
forming a wire overlying and directly contacting the contact via, wherein the wire and the first bond wire are concurrently formed.

11. The method according to claim 8, further comprising:
after the filling, forming a plurality of additional vias overlying the first and second bond wires; and
forming a third bond wire overlying the plurality of additional vias, wherein the plurality of additional vias extend from the second bond wire to the third bond wire, wherein a top layout of the third bond wire has a third area, and wherein a top layout of the plurality of additional vias has a fourth area that is more than 10% of the third area.

12. The method according to claim 8, further comprising:
after the filling, forming a plurality of additional vias overlying the first and second bond wires; and
forming a third bond wire overlying the plurality of additional vias, wherein the plurality of additional vias extend from the third bond wire, wherein a top layout of the third bond wire has a third area, wherein a top layout of the plurality of additional vias has a fourth area that is less than 1% of the third area, and wherein the third bond wire is thicker than the first and second bond wires.

13. The method according to claim 8, further comprising:
forming a device wire overlying the substrate on the frontside of the substrate, wherein the first bond wire is formed after the device wire is formed and is formed farther from the substrate than the device wire.

14. The method according to claim 8, wherein the via structure further has a third pair of sidewalls that are spaced from the ring-shaped sidewall and that extend continuously, in parallel with the first and second pairs of sidewalls, from the pad region to the ring-shaped region, in the plane, and wherein the third pair of sidewalls share a third length greater than the second length and are separated from each other by a third separation greater than the second separation.

15. The method according to claim 14, wherein each sidewall in the first, second, and third pairs of sidewalls extends from direct contact with a sidewall of the pad region to direct contact with a sidewall of the ring-shaped region in the plane.

16. The method according to claim 15, wherein the first, second, and third pairs of sidewalls are non-overlapping with each other and are on a common side of the pad region.

17. The method according to claim 8, wherein the pad region and the ring-shaped region extend vertically in a first dimension from direct contact with the first bond wire to direct contact with the second bond wire, and wherein the plane is formed by a second dimension and a third dimension, wherein the first, second, and third dimensions are orthogonal to each other.

18. A method for forming an integrated circuit (IC) chip, the method comprising:
- forming a first bond wire overlying a substrate on a first side of the substrate;
- forming a via overlying and directly contacting the first bond wire on the first side of the substrate and separated from the substrate by the first bond wire;
- forming a second bond wire overlying and directly contacting the via on the first side of the substrate and separated from the substrate by the via; and
- after the forming of the second bond wire, vertically flipping the substrate and forming a pad structure inset into the substrate from a second side of the substrate, opposite the first side of the substrate, wherein the first bond wire is directly between the second bond wire and the pad structure in a vertical dimension;
- wherein the via is in a plane orthogonal to the vertical dimension and has a first pair of sidewalls sharing a first common length in the plane, a second pair of sidewalls sharing a second common length in the plane, and a third pair of sidewalls sharing a third common length in the plane, wherein the first, second, and third pairs of sidewalls are parallel with each other in the plane and each extend from a sidewall of the via to another sidewall of the via in the plane, and wherein the first common length is less than the second common length, which is less than the third common length.

19. The method according to claim 18, wherein the first common length is at a width-wise center of the via in the plane, wherein the first, second, and third pairs of sidewalls are on a common side of the via in the plane, and wherein the first pair of sidewalls have a separation that is a same as a separation between the second pair of sidewalls and a separation between the third pair of sidewalls.

20. The method according to claim 19, wherein the via has a fourth pair of sidewalls sharing the first common length in the plane, a fifth pair of sidewalls sharing the second common length in the plane, and a sixth pair of sidewalls sharing the third common length in the plane, wherein the fourth, fifth, and sixth pairs of sidewalls are parallel with each other in the plane and each extend from a sidewall of the via to another sidewall of the via in the plane, and wherein the fourth, fifth, and sixth pairs of sidewalls are on an additional common side of the via in the plane that is opposite the common side of the via.

\* \* \* \* \*